US012731521B2

(12) United States Patent
Li et al.

(10) Patent No.: US 12,731,521 B2
(45) Date of Patent: Sep. 8, 2026

(54) SHIFT REGISTER UNIT, DISPLAY APPARATUS AND DRIVING METHOD

(71) Applicants: Hefei BOE Joint Technology Co., Ltd., Hefei (CN); BOE Technology Group Co., Ltd., Beijing (CN); Beijing BOE Technology Development Co., Ltd., Beijing (CN)

(72) Inventors: Yongqian Li, Beijing (CN); Zhidong Yuan, Beijing (CN); Ying Han, Beijing (CN); Pan Xu, Beijing (CN); Miao Liu, Beijing (CN); Xiuting Liu, Beijing (CN)

(73) Assignees: Hefei BOE Joint Technology Co., Ltd., Hefei (CN); BOE Technology Group, Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 276 days.

(21) Appl. No.: 18/711,901

(22) PCT Filed: Aug. 31, 2023

(86) PCT No.: PCT/CN2023/116135

§ 371 (c)(1),
(2) Date: May 21, 2024

(87) PCT Pub. No.: WO2025/043603

PCT Pub. Date: Mar. 6, 2025

(65) Prior Publication Data

US 2026/0170993 A1 Jun. 18, 2026

(51) Int. Cl.
*G09G 3/20* (2006.01)
*G11C 19/28* (2006.01)

(52) U.S. Cl.
CPC ... *G09G 3/2092* (2013.01); *G09G 2310/0267* (2013.01); *G09G 2310/0286* (2013.01); *G09G 2310/08* (2013.01); *G11C 19/28* (2013.01)

(58) Field of Classification Search
CPC .................... G09G 3/2092; G09G 2310/0286
See application file for complete search history.

(56) References Cited

U.S. PATENT DOCUMENTS

2022/0108657 A1* 4/2022 Feng .................. G09G 3/3677

FOREIGN PATENT DOCUMENTS

CN 101393858 B 3/2009
CN 105788555 A 7/2016
(Continued)

*Primary Examiner* — Scott D Au
(74) *Attorney, Agent, or Firm* — ArentFox Schiff LLP; Michael Fainberg

(57) ABSTRACT

Present disclosure relates to a shift register unit, a display apparatus and a driving method. The shift register unit includes: a decode control sub-circuit configured to, according to signal of gating control terminal, connect a first gating clock terminal and a first node; a node control sub-circuit coupled to the first, second and third nodes, and configured to, according to signal of first gating clock terminal, a second gating clock terminal and the first node, control signal of the second and the third nodes; an output sub-circuit coupled to the second and third nodes and drive output terminals electrically connected to output clock signal terminals. The output sub-circuit is configured to, according to signal of the second node, provide signals of the output clock signal terminals to the drive output terminals, and according to signal of the third node, provide signal of reference signal terminal to the drive output terminals.

20 Claims, 8 Drawing Sheets

(56) References Cited

FOREIGN PATENT DOCUMENTS

| | | | |
|---|---|---|---|
| CN | 108766383 | A | 11/2018 |
| CN | 111199713 | A | 5/2020 |
| CN | 113113069 | A | 7/2021 |
| KR | 10-2014-0064319 | A | 5/2014 |

* cited by examiner

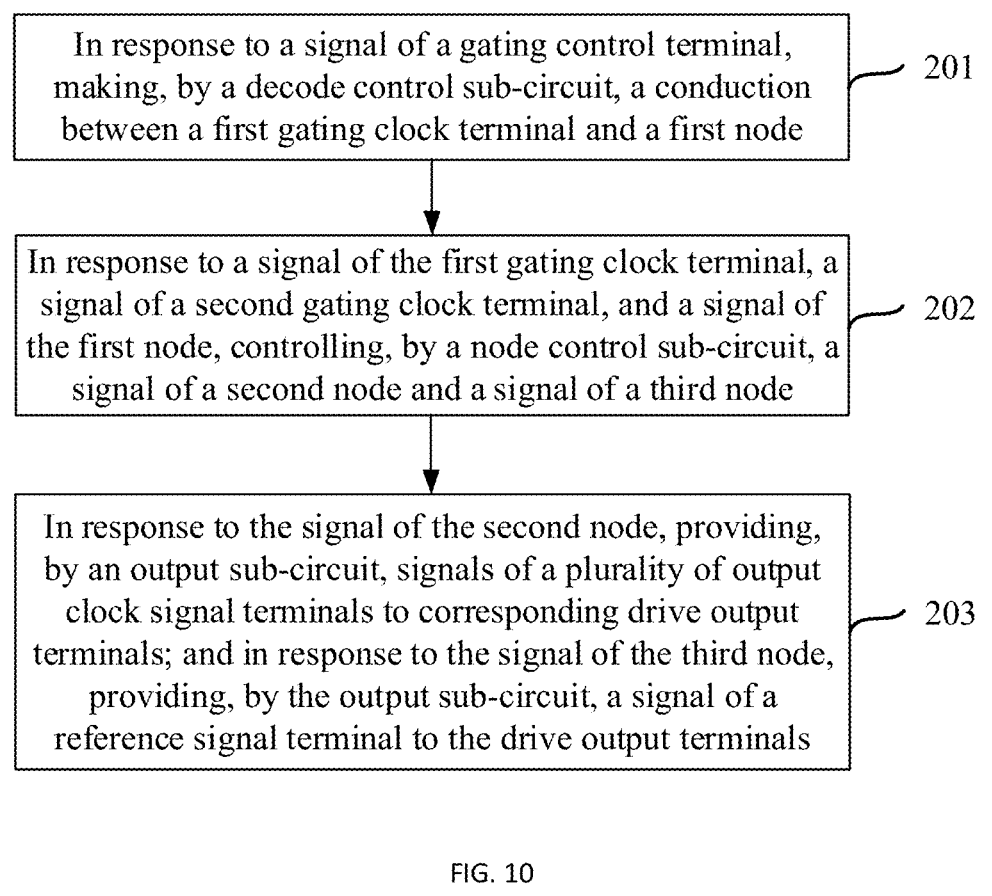

In response to a signal of a gating control terminal, making, by a decode control sub-circuit, a conduction between a first gating clock terminal and a first node — 201

In response to a signal of the first gating clock terminal, a signal of a second gating clock terminal, and a signal of the first node, controlling, by a node control sub-circuit, a signal of a second node and a signal of a third node — 202

In response to the signal of the second node, providing, by an output sub-circuit, signals of a plurality of output clock signal terminals to corresponding drive output terminals; and in response to the signal of the third node, providing, by the output sub-circuit, a signal of a reference signal terminal to the drive output terminals — 203

FIG. 10

SHIFT REGISTER UNIT, DISPLAY APPARATUS AND DRIVING METHOD

CROSS-REFERENCE TO RELATED APPLICATIONS

This application is a National Stage of International Application No. PCT/CN2023/116135, filed Aug. 31, 2023, which is hereby incorporated by reference in its entirety.

TECHNICAL FIELD

The present disclosure relates to the field of display technology, and provides a shift register unit, a display apparatus and a driving method.

BACKGROUND

At present, high-end displays, especially the game professional displays which require extremely high refresh frequency, have more stringent requirements for image quality. In order to achieve good compatibility in power consumption and extremely high refresh frequency, the regional high refresh rate technology (i.e., intra-frame frequency conversion, only dynamic images using high refresh frequency) is generally used, and requires the drive circuit can be turned on flexibly and with random gating capability.

SUMMARY

Embodiments of the present disclosure provide a shift register unit, a display apparatus, and a driving method for enhancing the flexibility of the output of a display apparatus.

Specific technical solutions provided by the present disclosure are as follows.

In a first aspect, embodiments of the present disclosure provide a shift register unit including: a decode control sub-circuit, a node control sub-circuit and an output sub-circuit;

the decode control sub-circuit is configured to, in response to a signal of a gating control terminal, make a conduction between a first gating clock terminal and a first node;

the node control sub-circuit is coupled to the first node, a second node and a third node, and is configured to, in response to a signal of the first gating clock terminal, a signal of a second gating clock terminal and a signal of the first node, control a signal of the second node and a signal of the third node;

the output sub-circuit is coupled to the second node, the third node and a plurality of drive output terminals, wherein the plurality of drive output terminals are electrically connected to a plurality of output clock signal terminals; and the output sub-circuit is configured to, in response to the signal of the second node, provide signals of the plurality of output clock signal terminals to the drive output terminals, and in response to the signal of the third node, provide a signal of a reference signal terminal to the plurality of drive output terminals.

In some possible implementations, the decode control sub-circuit includes: N gating transistors, wherein N is a positive integer greater than or equal to 1; and a control terminal of the gating transistor is coupled to the gating control terminal, a first terminal of the gating transistor is coupled to the first gating clock terminal, and a second terminal of the gating transistor is coupled to the first node.

In some possible implementations, the node control sub-circuit includes: a first node control sub-circuit, a second node control sub-circuit, a third node control sub-circuit and a fourth node control sub-circuit;

the first node control sub-circuit is coupled to the first node, and is configured to, in response to a signal of the second gating clock terminal, provide the signal of the first node and a signal of a first high-level signal terminal to the second node;

the second node control sub-circuit is coupled to the second node, and is configured to, in response to the signal of the first node, provide the signal of the second gating clock terminal to the second node;

the third node control sub-circuit is coupled to the first gating clock terminal, the second node and the third node, and is configured to, in response to the signal of the second node and a signal of a third gating clock terminal, provide a signal of a second high-level signal terminal and the signal of the first gating clock terminal to the third node; and the fourth node control sub-circuit is coupled to the third node, and is configured to, in response to the signal of the second gating clock terminal, provide a signal of a first low-level signal terminal to the third node.

In some possible implementations, the first node control sub-circuit includes: a first transistor and a first capacitor;

a control terminal of the first transistor is coupled to the second gating clock terminal, a first terminal of the first transistor is coupled to the first high-level signal terminal, and a second terminal of the first transistor is coupled to the second node; and a first terminal of the first capacitor is coupled to the first high-level signal terminal, and a second terminal of the first capacitor is coupled to the second node.

In some possible implementations, the second node control sub-circuit includes: a second transistor, a third transistor and a fourth transistor;

a control terminal of the second transistor is coupled to the first node, a first terminal of the second transistor is coupled to the second gating clock terminal, and a second terminal of the second transistor is coupled to a first terminal of the third transistor;

a control terminal of the third transistor is coupled to the first node, and a second terminal of the third transistor is coupled to the second node; and a control terminal of the fourth transistor is coupled to the second node, a first terminal of the fourth transistor is coupled to the first terminal of the third transistor, and a second terminal of the fourth transistor is coupled to the first high-level signal terminal.

In some possible implementations, the third node control sub-circuit includes: a fifth transistor, a sixth transistor and a seventh transistor;

a control terminal of the fifth transistor is coupled to the second node, a first terminal of the fifth transistor is coupled to a second terminal of the sixth transistor, and a second terminal of the fifth transistor is coupled to a first terminal of the seventh transistor;

a control terminal of the sixth transistor is coupled to the first gating clock terminal, a first terminal of the sixth transistor is coupled to the second high-level signal terminal, and the second terminal of the sixth transistor is coupled to the first terminal of the fifth transistor; and a control terminal of the seventh transistor is coupled to the third gating clock terminal, and a second terminal of the seventh transistor is coupled to the first gating clock terminal.

In some possible implementations, the fourth node control sub-circuit includes: an eighth transistor, a ninth transistor and a second capacitor;

a control terminal of the eighth transistor is coupled to the second gating clock terminal, a first terminal of the eighth transistor is coupled to the first node, and a second terminal of the eighth transistor is coupled to the first gating clock terminal;

a control terminal of the ninth transistor is coupled to a fifth node, a first terminal of the ninth transistor is coupled to the third node, and a second terminal of the ninth transistor is coupled to the first low-level signal terminal; and a first terminal of the second capacitor is coupled to the third node, and a second terminal of the second capacitor is coupled to the first low-level signal terminal.

In some possible implementations, the output sub-circuit includes: a first gating control sub-circuit and a plurality of output control sub-circuits;

the first gating control sub-circuit is configured to, in response to the signal of the second node and a signal of a third gating clock terminal, provide a signal of a first high-level signal terminal to a fourth node, and in response to the signal of the second gating clock terminal, provide the signal of the third gating clock terminal to the fourth node, and in response to a signal of a fifth node, provided a signal of a leakage control terminal to the fourth node; and the plurality of output control sub-circuits and the plurality of drive output terminals as well as the plurality of output clock signal terminals are in one-to-one correspondence; the output control sub-circuits is configured to, in response to the signal of the third gating clock terminal, make a conduction between the fourth node and the fifth node;

in response to the signal of the fifth node, provide a signal of an output clock signal terminal to a drive output terminal corresponding to the output clock signal terminal;

in response to the signal of the third node, provide the signal of the reference signal terminal to the drive output terminal; and in response to the signal of the third node, provide a signal of a first low-level signal terminal to the fifth node and the drive output terminal.

In some possible implementations, the first gating control sub-circuit includes: a tenth transistor, an eleventh transistor, a twelfth transistor, a thirteenth transistor, and a fourteenth transistor;

a control terminal of the tenth transistor is coupled to the second node, a first terminal of the tenth transistor is coupled to a second terminal of the eleventh transistor, and a second terminal of the tenth transistor is coupled to the fourth node;

a control terminal of the eleventh transistor is coupled to the third gating clock terminal, and a first terminal of the eleventh transistor is coupled to the first high-level signal terminal;

a control terminal of the twelfth transistor is coupled to the second gating clock terminal, a first terminal of the twelfth transistor is coupled to the third gating clock terminal, and a second terminal of the twelfth transistor is coupled to a first terminal of the fourteenth transistor;

a control terminal of the thirteenth transistor is coupled to the second gating clock terminal, a first terminal of the thirteenth transistor is coupled to the first terminal of the twelfth transistor, and a second terminal of the thirteenth transistor is coupled to the fourth node;

a control terminal of the fourteenth transistor is coupled to the fifth node, and the second terminal of the fourteenth transistor is coupled to the leakage control terminal.

In some possible implementations, the output control sub-circuit includes: a fifteenth transistor, a sixteenth transistor, a seventeenth transistor, an eighteenth transistor, a nineteenth transistor and a third capacitor;

a control terminal of the fifteenth transistor is coupled to the third gating clock terminal, a first terminal of the fifteenth transistor is coupled to the fourth node, and a second terminal of the fifteenth transistor is coupled to the fifth node;

a control terminal of the sixteenth transistor is coupled to the fifth node, a first terminal of the sixteenth transistor is coupled to the first output clock signal terminal, and a second terminal of the sixteenth transistor is coupled to the drive output terminal;

a control terminal of the seventeenth transistor is coupled to the third node, a first terminal of the seventeenth transistor is coupled to the drive output terminal, and a second terminal of the seventeenth transistor is coupled to a second low-level signal terminal;

a control terminal of the eighteenth transistor is coupled to the third node, a first terminal of the eighteenth transistor is coupled to the fifth node, and a second terminal of the eighteenth transistor is coupled to a first terminal of the nineteenth transistor;

a control terminal of the nineteenth transistor is coupled to the third node, and a second terminal of the nineteenth transistor is coupled to the first low-level signal terminal; and a first terminal of the third capacitor is coupled to the fifth node, and a second terminal of the third capacitor is coupled to the drive output terminal.

In some possible implementations, the shift register unit further includes an initialization control sub-circuit; the initialization control sub-circuit is coupled to the second node and the third node; and the initialization control sub-circuit is configured to, in response to a signal of an initialization signal terminal, provide a signal of a first low-level signal terminal to the second node, and in response to the signal of the initialization signal terminal, provide a signal of a first high-level signal terminal to the third node.

In some possible implementations, the initialization control sub-circuit includes: a twentieth transistor, a twenty-first transistor, and a twenty-second transistor;

a control terminal of the twentieth transistor is coupled to the initialization signal terminal, a first terminal of the twentieth transistor is coupled to the second node, and a second terminal of the twentieth transistor is coupled to a first terminal of the twenty-second transistor;

a control terminal of the twenty-first transistor is coupled to the initialization signal terminal, a first terminal of the twenty-first transistor is coupled to the first high-level signal terminal, and a second terminal of the twenty-first transistor is coupled to the third node; and a control terminal of the twenty-second transistor is coupled to the initialization signal terminal, and a second terminal of the twenty-second transistor is coupled to a second terminal of a second capacitor.

In a second aspect, embodiments of the present disclosure further provide a display apparatus including: a gate drive circuit as described above.

In a third aspect, embodiments of the present disclosure further provide a display apparatus including: a plurality of gate lines and a plurality of shift register units of any of the foregoing;

the plurality of gate lines are coupled one-to-one with the plurality of drive output terminals in the plurality of shift register units.

In some possible implementations, a first clock signal terminal of a $(3k-2)^{th}$ stage shift register unit is coupled to one clock terminal that is the second gating clock terminal, a second clock signal terminal of the $(3k-2)^{th}$ stage shift register unit is coupled to one clock terminal that is the first gating clock terminal, and a third clock signal terminal of the $(3k-2)^{th}$ stage shift register unit is coupled to one clock terminal that is a third gating clock terminal;

a first clock signal terminal of a shift register units of the $(3k-1)^{th}$ stage is coupled to one clock terminal that is the first gating clock terminal, a second clock signal terminal of the shift register units of the $(3k-1)^{th}$ stage is coupled to one clock terminal that is the third gating clock terminal, and a third clock signal terminal of the shift register units of the $(3k-1)^{th}$ stage is coupled to one clock terminal that is the second gating clock terminal; and a first clock signal terminal of a $3k^{th}$ stage shift register unit is coupled to one clock terminal that is the third gating clock terminal, a second clock signal terminal of the $3k^{th}$ stage shift register unit is coupled to one clock terminal that is the second gating clock terminal, and a third clock signal terminal of the $3k^{th}$ stage shift register unit is coupled to one clock terminal that is the first gating clock terminal; wherein k is a positive integer.

In some possible implementations, gating control terminals of the $(3k-2)^{th}$ stage shift register unit, the $(3k-1)^{th}$ stage shift register unit, and the $3k^{th}$ stage shift register unit are coupled to one signal line group, wherein k is a positive integer.

In some possible implementations, gating control terminals of $(6k-5)^{th}$ stage shift register unit, $(6k-4)^{th}$ stage shift register unit, and $(6k-3)^{th}$ stage shift register unit are coupled to a first signal line group; and gating control terminals of $(6k-2)^{th}$ stage shift register unit, $(6k-1)^{th}$ stage shift register unit, and $6k^{th}$ stage shift register unit are coupled to a second signal line group; wherein output signals of the first signal line group are different from output signals of the second signal line group, and k is a positive integer.

In some possible implementations, the display apparatus further includes a decoder, wherein output terminals of the decoder provide different output signals for the first signal line group and the second signal line group.

In some possible implementations, shift register units correspondingly connected to signal line groups having the same output signals are in the same one display partition.

In a fourth aspect, embodiments of the present disclosure also provide a driving method of a shift register unit, including:

in response to a signal of a gating control terminal, making, by a decode control sub-circuit, a conduction between a first gating clock terminal and a first node;

in response to a signal of the first gating clock terminal, a signal of a second gating clock terminal, and a signal of the first node, controlling, by a node control sub-circuit, a signal of a second node and a signal of a third node; and in response to the signal of the second node, providing, by an output sub-circuit, signals of a plurality of output clock signal terminals to corresponding drive output terminals; and in response to the signal of the third node, providing, by the output sub-circuit, a signal of a reference signal terminal to the drive output terminals.

BRIEF DESCRIPTION OF FIGURES

The accompanying drawings illustrated herein are used to provide a further understanding of the present disclosure and form a part hereof, and the schematic embodiments of the disclosure and the description thereof are used to explain the disclosure and do not constitute an undue limitation thereof. In the accompanying drawings.

FIG. 10 shows a flowchart of a driving method of a shift register unit in the related art.

DETAILED DESCRIPTION

In order to make the objects, technical solutions and advantages of the embodiments of the present disclosure clearer, the technical solutions of the embodiments of the present disclosure will be described clearly and completely in the following in conjunction with the accompanying drawings of the embodiments of the present disclosure. Obviously, the described embodiments are a part of the embodiments of the present disclosure and not all of the embodiments. The embodiments and the features in the embodiments of the present disclosure can be combined with each other without conflict. Based on the described embodiments of the present disclosure, all other embodiments obtained by a person of ordinary skill in the art without the need for creative labor are within the claimed scope of the present disclosure.

Unless otherwise defined, technical or scientific terms used in the present disclosure shall have the ordinary meaning understood by a person of ordinary skill in the art to which the present disclosure belongs. The terms "first", "second", and the like as used in the present disclosure do not indicate any order, number, or significance, but are only used to distinguish different components. The words "including" or "comprising" and the like are intended to mean that the component or object preceded by the word encompasses the components or objects listed after the word and their equivalents, and does not exclude other components or objects. Words such as "connected" or "coupled" are not limited to physical or mechanical connections, but may include electrical connections, whether direct or indirect.

It should be noted that the dimensions and shapes of the figures in the accompanying drawings do not reflect true proportions, but are intended to be illustrative of the invention only. And throughout the same or similar labeling denotes the same or similar elements or elements having the same or similar function.

Figure 1:
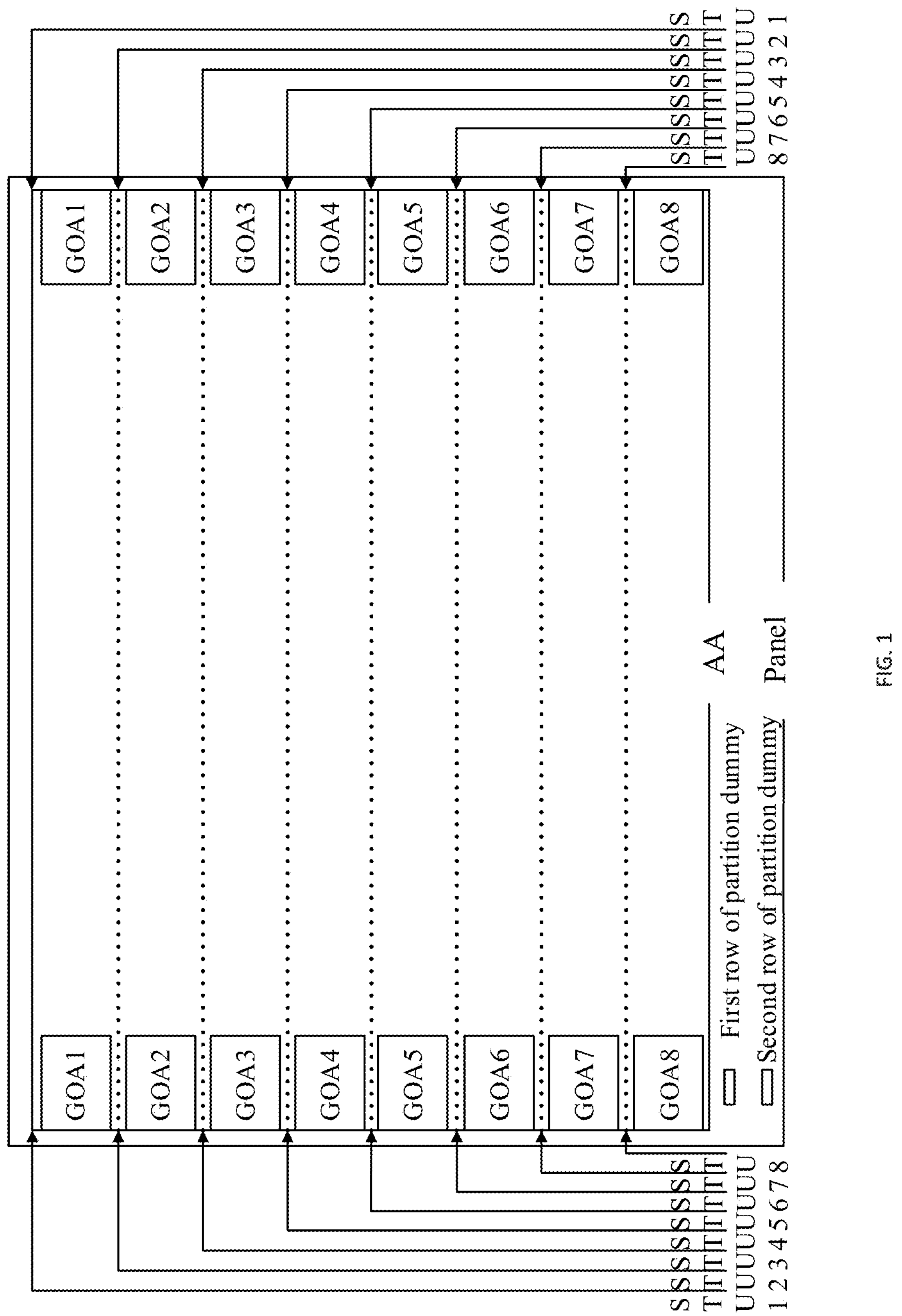
FIG. 1 shows a schematic diagram of a shift register unit in the related art.

With the increase in pixel per inch (PPI) of the display and the popularity of virtual reality (VR), augmented reality (AR) and 3D display applications, in order to reduce the frame transmission data, the drive the circuit also needs to have a random gating capability to ensure high-definition and high-frequency driving for the dynamic region or the viewing region. Existing shift register circuits can only be turned on sequentially from the first row of pixel units to the last row of pixel units, resulting in a single driving capability of the display which cannot be adjusted in real time according to the image and cannot meet the requirements of high-end display. Referring to FIG. 1, in order to achieve regional high refresh rate technology by the traditional shift registers, it is necessary to, when design, divide the shift registers into several partitions, so as to locally control a high refresh rate of a certain partition. Additionally, after setting the partitions, the maximum number of partitions cannot be changed, and as shown in FIG. 1, the maximum number of partitions can only be 8. If more partitions are required, more STU signals and Dummy units are required. That is, the setting partition of the traditional shift registers increases the hardware complexity.

In the related art, in order to realize the regional high refresh rate technology in the display apparatus, it is necessary to, when design, pre-divide the shift registers included in the display apparatus into several fixed partitions, so as to locally control the high refresh rate of a certain partition. It is obvious that the shift register itself is unable to be flexibly enabled according to the requirements. Moreover, after setting the display apparatus into partitions, the maximum number of partitions cannot be changed, and as shown in FIG. 1, the maximum number of partitions can only be eight partitions. If more partitions are required, more hardware, such as STU signals and dummy gate driver on array (GOA) units, need to be added additionally.

In FIG. 1, 8 STU signals are added at each end of two ends of a region AA to connect with the eight GOA partitions in the region AA, and the STU signal is a start signal for a driving GOA in each partition to ensure that the display via the pixel units in each partition is normal.

In addition, two dummy GOA units need to be provided in the region AA for providing a reset cascade signal for the first row of GOAs in the first partition and a reset cascade signal for the last row of GOAs in the eighth partition, respectively, in order to ensure the display in the next frame via the pixel units in the entire region AA. It should be noted that in the related art, after utilizing the STU signals and the dummy GOA units for partition design, the maximum number of partitions cannot be changed, and only fixed rows and not any row can be turned on.

Figure 2:
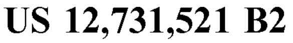
FIG. 2 shows a schematic diagram of a shift register unit in embodiments of the present disclosure.
Figure 2:
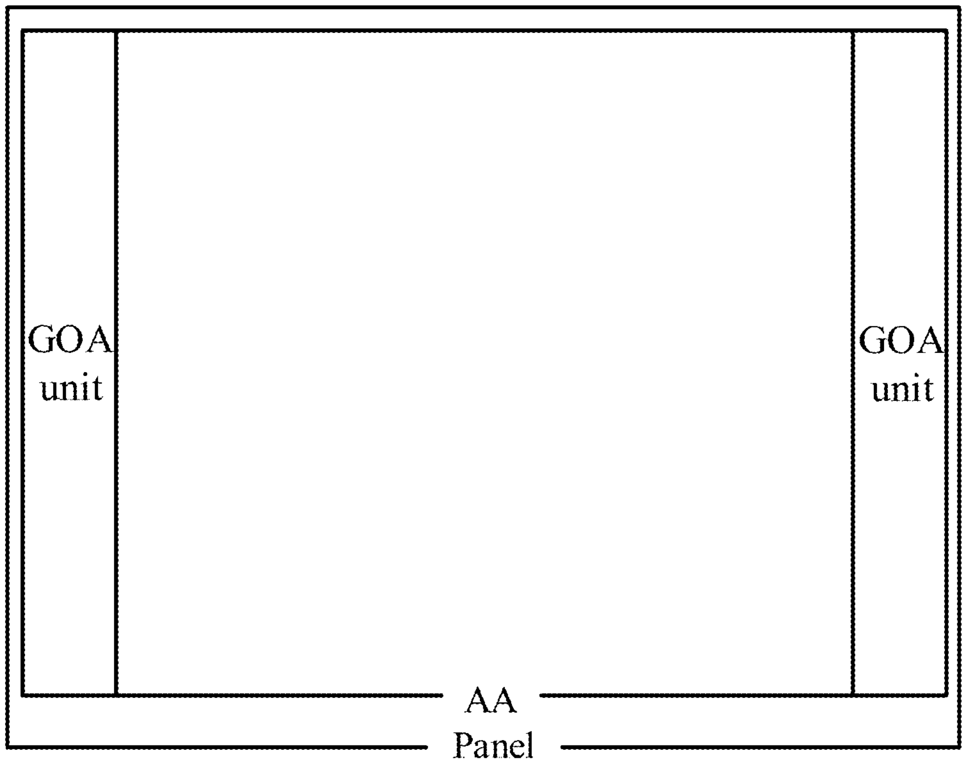
Figure 3:
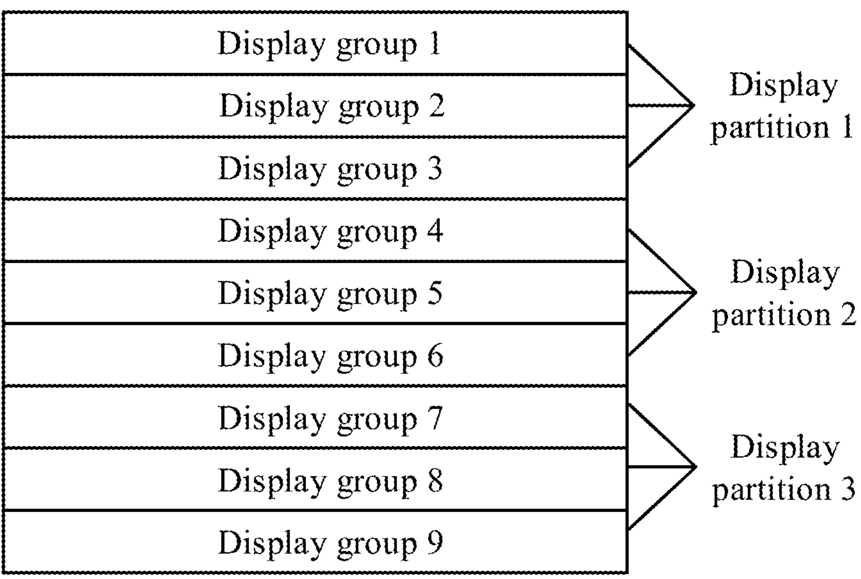
FIG. 3 shows a schematic diagram of a display division for a display apparatus in embodiments of the present disclosure.

Referring to FIGS. 2 and 3, a shift register unit, a display apparatus, and a driving method are provided by embodiments of the present disclosure, in which shift registers included in the display apparatus is divided into multiple display partitions according to different combinations of signals of multiple gating control terminals, and shift registers included in the same one display partition is further divided into multiple display groups, i.e., shift register units, according to different combinations of signals in multiple gating clock terminals. In this manner, flexible output of different display groups and different shift register units for display in the display apparatus is realized according to the different gating conditions of the gating control terminals and the gating clock terminals.

As can be seen from FIG. 2, there is no need to divide the region AA into display partitions by means of STU signals and dummy GOA units or the like, but instead, circuits within the GOA are improved, and a plurality of GOA units that are improved are used to drive the outputs of the corresponding row pixel units for display.

The display apparatus shown in FIG. 2 provided by embodiments of the present disclosure includes: a plurality of pixel units arranged in an array, a plurality of gate lines, a plurality of data lines, a plurality of shift register units, and a source drive circuit. Each pixel unit includes a plurality of sub-pixels. For example, the pixel unit may include a red sub-pixel, a green sub-pixel, and a blue sub-pixel, so that color mixing can be performed by red, green, and blue to achieve a color display. Alternatively, the pixel unit may include a red sub-pixel, a green sub-pixel, a blue sub-pixel, and a white sub-pixel, so that color mixing can be performed by red, green, blue, and white to achieve a color display. Of course, in practice, the light emitting colors of the sub-pixels in the pixel unit may be designed and determined according to the actual application environment, which is not limited herein.

Exemplarily, the plurality of shift register units are coupled to the plurality of gate lines, and the source drive circuit is coupled to the plurality of data lines. When the display apparatus is operating, a control signal is input to the shift register unit, so that the shift register unit outputs a signal to the coupled gate lines to drive the gate lines. Moreover, the source drive circuit inputs data voltages to the data lines according to the display data, thereby charging the sub-pixels so that the sub-pixels are input into the corresponding data voltages to realize the image display function.

Exemplarily, the source drive circuits may be set to 2, wherein one source drive circuit may be connected to half the number of data lines, and the other source drive circuit may be connected to the other half of the number of data lines. Of course, in practice, the source drive circuits may also be provided with 3, 4, or more, which may be determined according to the needs of the actual application environment, which is not limited herein.

In some embodiments of the present disclosure, one column of sub-pixels may correspond to one data line. Of course, one column of sub-pixels may correspond to multiple data lines, which is not limited herein.

In some embodiments of the present disclosure, the plurality of gate lines may include: a plurality of first gate lines and a plurality of second gate lines. Optionally, one row of sub-pixels may correspond to one first gate line and one second gate line. Of course, one row of sub-pixels may also correspond to multiple first grid lines, and, one row of sub-pixels may also correspond to multiple second grid lines, which is not limited herein.

In some embodiments of the present disclosure, the display apparatus further includes: a plurality of light emitting control signal lines and a plurality of reset control signal lines. Optionally, one row of sub-pixels may correspond to one light emitting control signal line and one reset control signal line. Of course, one row of sub-pixels may also correspond to multiple light emitting control signal lines, and one row of sub-pixels may also correspond to multiple reset control signal lines, which is not limited herein.

The display apparatus may be driven unilaterally or bilaterally. For example, referring to FIG. 2, when bilateral driving is employed, the shift register includes one GOA unit on the left side and the other GOA unit on the right side coupled to both sides of the gate lines; the one GOA unit on the left side and the other GOA unit on the right side are used to simultaneously drive the coupled gate lines.

In the embodiment of the present disclosure, the above GOA units are provided, so that the display partition is adjusted by means of gating signals, which is flexible and changeable, and to a certain extent, it is possible to realize that any row is turned on.

Referring to FIG. 3, assuming that the entire display region AA is divided into a total of three display partitions, namely, a display partition 1, a display partition 2, and a display partition 3. The display partitions may be further subdivided in order to be more flexible in gating the outputs of the relevant pixel units. For example, by adopting the scheme shown in FIG. 3, each display partition is further divided into 3 display groups, that is, the display partition 1 is divided into a display group 1, a display group 2 and a display group 3, the display partition 2 is divided into a display group 4, a display group 5, and a display group 6, and the display partition 3 is divided into a display group 7, a display group 8, and a display group 9. In this manner, the division of the entire region AA is realized.

It should be added that the shift register unit in the present disclosure includes at least two drive output terminals, and the at least two drive output terminals simultaneously output signals externally to realize the image display at a high refresh rate.

The preferred embodiments of the present disclosure are described in detail below in connection with the accompanying drawings.

Figure 4:
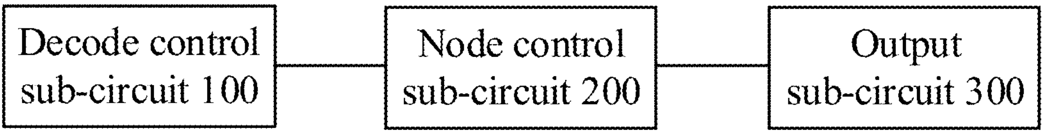
FIG. 4 shows a schematic diagram of a connection in a shift register unit in embodiments of the present disclosure.

Referring to FIG. 4, an embodiment of the present disclosure shows a shift register unit including: a decode control sub-circuit 100, a node control sub-circuit 200, and an output sub-circuit 300.

The decode control sub-circuit 100 is configured to make a conduction between a first gating clock terminal CLKD1 and a first node N1 in response to signals of gating control terminals D0 to D7.

In the embodiments of the present disclosure, the number of gating control terminals D0 to D7 is multiple, and the signals of the plurality of gating control terminals D0 to D7 can be combined to accordingly turn on one shift register unit, i.e., one output sub-circuit 300. Different from the traditional shift register, the output sub-circuit 300 includes multiple drive output terminals Output1 to Output4. After the output sub-circuit 300 is enabled by the signals of the gating control terminals D0 to D7, the multiple drive output terminals Output1 to Output4 simultaneously output signals, that is, the output for display of one shift register unit is realized.

In the implementation, when one of the signals of the gating control terminals D0 to D7 is valid, the decode control sub-circuit 100 makes a conduction between the first gating clock terminal CLKD1 with the first node N1, i.e., sets the level of the first node N1 to be a high level by the first gating clock terminal CLKD1.

Figure 7:
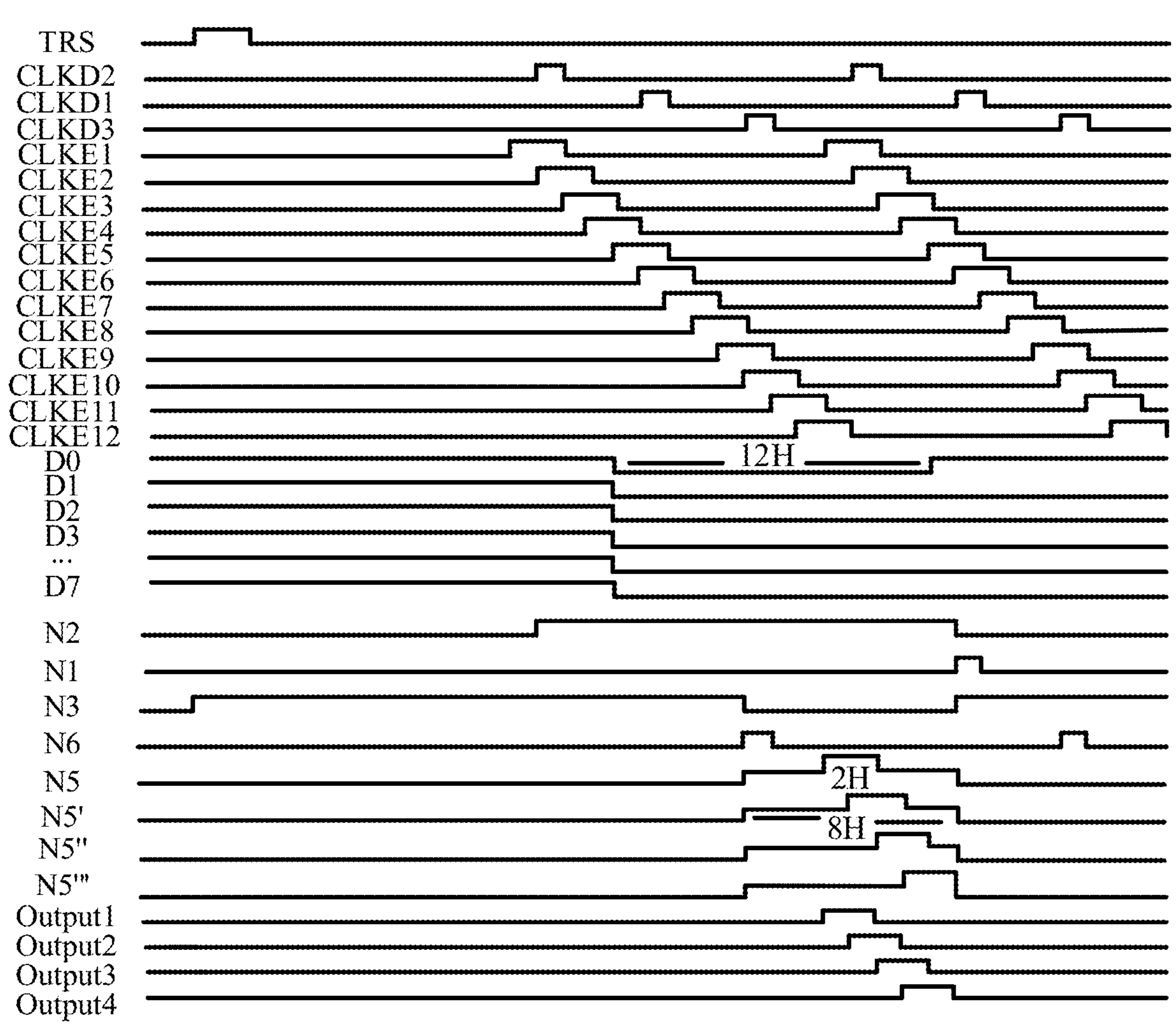
FIG. 7 shows a working timing diagram of a shift register unit in embodiments of the present disclosure.

After multiple display partitions are set up for the display apparatus, different shift register units are further set up for the display partitions, and the division of the shift register units is realized by multiple gating clock terminals. In the embodiments of the present disclosure, a first gating clock terminal CLKD1, a second gating clock terminal CLKD2, and a third gating clock terminal CLKD3 are included, i.e., three shift register units are set in one display partition. It should be noted that the signal provided by the first gating clock terminal CLKD1 is a pulse signal, and the moments corresponding to the rising and falling edges of the first gating clock terminal CLKD1, the second gating clock terminal CLKD2, and the third gating clock terminal CLKD3 are different, as shown in FIG. 7. In this manner, different combinations of the first gating clock terminal CLKD1, the second gating clock terminal CLKD2, and the third gating clock terminal CLKD3 correspond to different shift register units (i.e., output sub-circuits 300).

Figure 5:
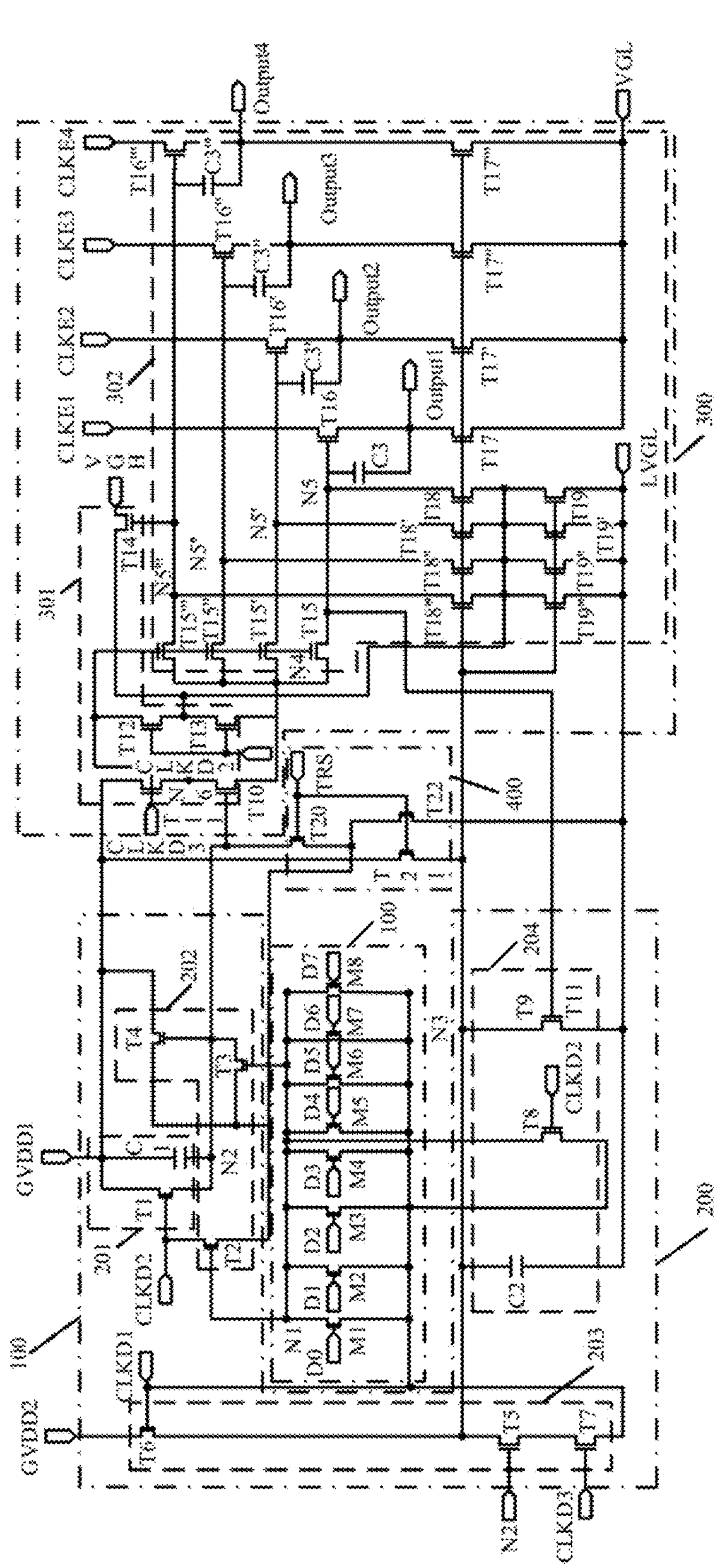
FIG. 5 shows a circuit connection diagram in a shift register unit in embodiments of the present disclosure.

Referring to FIG. 5, the decode control sub-circuit 100 includes: N gating transistors, wherein N is a positive integer greater than or equal to 1.

Control terminals of the gating transistors are coupled to the gating control terminals D0 to D7, first terminals of the gating transistors are coupled to the first gating clock terminal CLKD1, and second terminals of the gating transistors are coupled to the first node N1.

In order to receive the signals of the gating control terminals D0 to D7, the embodiments of the present disclosure is provided with N gating transistors. For each gating transistor, the control terminal of the gating transistor is coupled to one of the gating control terminals D0 to D7, the first terminal of the gating transistor is coupled to the first gating clock terminal CLKD1, and the second terminal of the gating transistor is coupled to the first node N1, so that when the gating transistor is turned on, the signal of the first gating clock terminal CLKD1 is provided to the first node N1.

Referring to FIG. 5, the gating control terminals D0 to D7 include the gating transistors M1, M2, M3, M4, M5, M6, M7 and M8. The number of transistors is related to the number of display partitions to be set in the display apparatus. When the number of display partitions to be set in the display apparatus is larger, the number of transistors is also larger. For example, when the number of transistors is set to 8, the signals of each of the gating control terminals D0 to D7 have two states of 0 and 1, so that there are 256 combinations of the signals of the gating control terminals D0 to D7, that is, at most 256 display partitions, i.e., output sub-circuits 300, may be enabled to meet the display requirements of the display apparatus.

For example, when the signal of the gating control terminal D0 coupled to the gating transistor M1 is at a high level, the gating transistor M1 is turned on, and when the signals of the remaining gating control terminals D1 to D7 coupled to the gating transistors M2, M3, M4, M5, M6, M7 and M8 are at a low level, the gating transistors M2, M3, M4, M5, M6, M7 and M8 are all turned off. The high level signal of the first gating clock terminal CLKD1 is provided to the first node N1 via the turned-on gating transistor M1.

It should be added that, as long as one of the gating transistors M1, M2, M3, M4, M5, M6, M7 and M8 is turned on, the high level signal of the first gating clock terminal CLKD1 is provided to the first node N1 through the turned-on gating transistor. Only when the signals of the gating control terminals D0 to D7 each are at a low level, and the gating transistors M1, M2, M3, M4, M5, M6, M7 and M8 are all turned off, the high level signal of the first gating clock terminal CLKD1 cannot be provided to the first node N1 through the transistors, and the level of the first node N1 is the low level.

Assuming that, when the gating transistors M1, M2, M3, M4, M5, M6, M7 and M8 are all turned off, i.e., when the signals of the gating control terminals D0 to D7 are 10,000, 000, the signal of the first node N1 is at a high level. In this case, the control terminals is enabled and a second transistor T2 and a third transistor T3 coupled to the first node N1 are both turned on, the low level signal of the second gating clock terminal CLKD2 is provided to the second node N2, and the signal of the second node N2 is at a low level, i.e., the pull-up node is invalid, and any of the display partitions is unable to be enabled.

It should be added that the above "0" represents a low level signal and the above "1" represents a high level signal.

Similarly, as long as one of the gating transistors M1, M2, M3, M4, M5, M6, M7 and M8 is turned on, that is, the signals of the gating control terminals D0 to D7 each are not 00000000, in this case, the signal of the second node N2 is a low level signal, and any of the display partitions is unable to be enabled. Only when the signals of the gating control terminals D0 to D7 are 00000000, the signal of the first node N1 is at a low level and the signal of the second node N2 is at a high level, in which case one display partition of the display apparatus can be enabled.

Still with the above assumptions for additional explanation, since the signals at terminals D0 to D7 are signals transmitted in parallel, the corresponding inverse signals at terminals D0' to D7' are also signals transmitted in parallel. Thus, the gating control terminals D0 to D7, after receiving the externally input signals, provide the signals at terminals D0 to D7 to the gating transistors of the different display partitions. Similarly, the signals at terminals D0' to D7' are simultaneously provided to the gating transistors of different display partitions, that is to say, at the same moment, the signals of the various gating control terminals D0 to D7 are unique depending on the externally input signals, but since the various gating transistors of different display partitions. That is, the signal of each gating control terminal D0 to D7 is unique and depends on the external input signal. However, since the connection relationships between the respective gating transistors in different display partitions and the respective gating control terminals D0 to D7 and D0' to D7' are different, that is, the signals received by the gating transistors are any eight of signals at terminals D0 to D7 and terminals D0' to D7'. Therefore, at the same one moment, only one display partition can receive the signals of 00000000, and other display partitions receive signals other than 00000000.

After the display partition to be enabled is determined, the decode control sub-circuit 100 needs to combine with the node control sub-circuit 200 to select which shift register unit, i.e., an output sub-circuit 300 the drive output terminals Output1 to Output4 of which is used to output for display, in the display partition.

Referring to FIG. 5, the node control sub-circuit 200 is coupled to the first node N1, the second node N2, and the third node N3, and is configured to, in response to the signal of the first gating clock terminal CLKD1, the signal of the second gating clock terminal CLKD2, and the signal of the first node N1, control the signal of the second node N2 and the signal of the third node N3.

In the implementation, in order to effectively control the drive output terminals Output1 to Output4, it is necessary to control the pull-up node and the pull-down node, i.e., it is necessary to control the signal of the second node N2 and the signal of the third node N3. That is, it is necessary to control the signal of the second node N2 and the signal of the third node N3 according to the signal of the first gating clock terminal CLKD1, the signal of the second gating clock terminal CLKD2 and the signal of the first node N1.

Specifically, the node control sub-circuit 200 includes: a first node control sub-circuit 201, a second node control sub-circuit 202, a third node control sub-circuit 203, and a fourth node control sub-circuit 204.

The first node control sub-circuit is coupled to the first node N1, and is configured to, in response to a signal of the second gating clock terminal CLKD2, provide the signal of the first node N1 and the signal of the first high-level signal terminal GVDD1 to the second node N2.

The first node control sub-circuit 201 mainly provides an initialization signal to the second node N2. In the implementation, when the signal of the second gating clock terminal CLKD2 is at a high level, the signal of the first gating clock terminal CLKD1 is at a low level. Even if a gating transistor is turned on, the signal of the first node N1 is at the low level. In this case, both the second transistor T2 and the third transistor T3 are turned off, the high level signal of the first high-level signal terminal GVDD1 is provided to the second node N2, that is, the initialization level of the second node N2 is the high level.

Referring to FIG. 5, the first node control sub-circuit 201 includes: a first transistor T1 and a first capacitor C1.

A control terminal of the first transistor T1 is coupled to the second gating clock terminal CLKD2, a first terminal of the first transistor T1 is coupled to the first high-level signal terminal GVDD1, and a second terminal of the first transistor T1 is coupled to the second node N2.

In the implementation, when the level of the second gating clock terminal CLKD2 is a high level, the first transistor T1 is turned on, and the signal of the first high-level signal terminal GVDD1 is provided to the second node N2 via the turned-on first transistor T1.

A first terminal of the first capacitor C1 is coupled to the first high-level signal terminal GVDD1, and a second terminal of the first capacitor C1 is coupled to the second node N2.

In the implementation, the function of the two terminals of the first capacitor C1 is mainly to stabilize the voltage.

The second node control sub-circuit 202 is coupled to the second node N2, and is configured to, in response to the signal of the first node N1, provide the signal of the second gating clock terminal CLKD2 to the second node N2.

In the implementation, a high or low level of the first node N1 affects a high or low level of the second node N2. Referring to FIG. 5, when the level of the first node N1 is a high level, the level of the second node N2 is a low level, and when the level of the first node N1 is a low level, the level of the second node N2 is a high level.

Referring to FIG. 5, the second node control sub-circuit 202 includes: a second transistor T2, a third transistor T3, and a fourth transistor T4.

A control terminal of the second transistor T2 is coupled to the first node N1, a first terminal of the second transistor T2 is coupled to a second gating clock terminal CLKD2, and a second terminal of the second transistor T2 is coupled to a first terminal of the third transistor T3.

In the implementation, when the level of the first node N1 is a high level, the control terminal of the second transistor T2 is at a high level and the second transistor T2 is turned on.

A control terminal of the third transistor T3 is coupled to the first node N1, and a second terminal of the third transistor T3 is coupled to the second node N2.

Similarly, the third transistor T3 is turned on when the level of the first node N1 is at a high level. A low level of the second gating clock terminal CLKD2 is provided to the second node N2 via the turned-on second transistor T2 and the turned-on third transistor T3, and the level of the second node N2 changes from the high level to low level.

It should be added that when the first gating clock terminal CLKD1 is at a high level, the second gating clock terminal CLKD2 and the third gating clock terminal CLKD3 both are at a low level.

A control terminal of the fourth transistor T4 is coupled to the second node N2, a first terminal of the fourth transistor T4 is coupled to the first terminal of the third transistor T3, and a second terminal of the fourth transistor T4 is coupled to the first high-level signal terminal GVDD1.

It should be noted that when the level of the second node N2 is a high level, the control terminal of the fourth transistor T4 is at a high level, the fourth transistor T4 is turned on, and the signal of the first high-level signal terminal GVDD1 is provided to the initialization control sub-circuit 400 via the turned-on fourth transistor T4.

The third node control sub-circuit 203 is coupled to the first gating clock terminal CLKD1, the second node N2, and the third node N3, and is configured to, in response to the signal of the second node N2 and the signal of the third gating clock terminal CLKD3, provide the signal of the second high-level signal terminal GVDD2 and the signal of the first gating clock terminal CLKD1 to the third node N3.

In the embodiments of the present disclosure, the fifth transistor T5 is turned on when the second node N2 is at a high level, the sixth transistor T6 is turned on when the signal of the first gating clock terminal CLKD1 is at a high level, the seventh transistor T7 is turned on when the signal of the third gating clock terminal CLKD3 is at a high level. The above mentioned transistors acts to provide the signal of the second high-level signal terminal GVDD2 and the signal of the first gating clock terminal CLKD1 to the third node N3, i.e., the pull-down node.

Referring to FIG. 5, the third node control sub-circuit 203 includes: a fifth transistor T5, a sixth transistor T6, and a seventh transistor T7.

The fifth transistor T5 is connected to the other transistors in the figure in the following relationship: a control terminal of the fifth transistor T5 is coupled to the second node N2, a first terminal of the fifth transistor T5 is coupled to a second terminal of the sixth transistor T6, and a second terminal of the fifth transistor T5 is coupled to a first terminal of the seventh transistor T7.

In the implementation, when the second node N2 is at a high level, the control terminal of the fifth transistor T5 is at a high level and the fifth transistor T5 is turned on.

The sixth transistor T6 is connected to the other transistors in the figure in the following relationship: a control terminal of the sixth transistor T6 is coupled to the first gating clock terminal CLKD1, a first terminal of the sixth transistor T6 is coupled to the second high-level signal terminal GVDD2, and a second terminal of the sixth transistor T6 is coupled to the first terminal of the fifth transistor T5.

In the implementation, when the signal of the first gating clock terminal CLKD1 is at a high level, the control terminal of the sixth transistor T6 is at a high level and the sixth transistor T6 is turned on.

The seventh transistor T7 is connected to the other transistors in the figure in the following relationship: a control terminal of the seventh transistor T7 is coupled to the third gating clock terminal CLKD3, and a second terminal of the seventh transistor T7 is coupled to the first gating clock terminal CLKD1.

In the implementation, the seventh transistor T7 is turned on when the signal of the third gating clock terminal CLKD3 is at a high level. In this manner, the high level of the second high-level signal terminal GVDD2 makes the third node N3 at a high level via the turned-on sixth transistor T6, i.e., the pull-down node is at the high level. The signal of the first gating clock terminal CLKD1 is provided to the third node N3 via the turned-on fifth transistor T5 and the turned-on seventh transistor T7, and the level of the third node N3 is a low level.

The control unit of the fourth node N4 is coupled to the third node N3, and is configured to, in response to the signal of the second gating clock terminal CLKD2, provide the signal of the first low-level signal terminal LVGL to the third node N3.

In the implementation, the control unit of the fourth node N4 is mainly used to control the level of the first node N1 and the level of the third node N3.

Referring to FIG. 5, the control unit of the fourth node includes: an eighth transistor T8, a ninth transistor T9, and a second capacitor C2.

A control terminal of the eighth transistor T8 is coupled to the second gating clock terminal CLKD2, a first terminal of the eighth transistor T8 is coupled to the first node N1, and a second terminal of the eighth transistor T8 is coupled to the first gating clock terminal CLKD1.

In the implementation, when the signal of the second gating clock terminal CLKD2 is at a high level, the control terminal of the eighth transistor T8 is at a high level, and the eighth transistor T8 is turned on. The signal of the first gating clock terminal CLKD1 is provided to the first node N1, and the eighth transistor T8 is set here mainly to be used to clear the first node N1, that is, the low level signal of the first gating clock terminal CLKD1 is provided to the first node N1.

A control terminal of the ninth transistor T9 is coupled to the fifth node N5, a first terminal of the ninth transistor T9 is coupled to the third node N3, and a second terminal of the ninth transistor T9 is coupled to the first low-level signal terminal LVGL.

In the implementation, when the fifth node N5 is at a high level, i.e., when the drive output terminals Output1 to Output4 output signals outwardly, the signal of the first low-level signal terminal LVGL is provided to the third node N3 via the turned-on ninth transistor T9, i.e., the pull-down node is at a low level.

A first terminal of the second capacitor C2 is coupled to the third node N3, and a second terminal of the second capacitor C2 is coupled to the first low-level signal terminal LVGL.

The second capacitor C2 is provided between the first low-level signal terminal LVGL and the pull-down node to stabilize the voltage.

Focusing on the output sub-circuit 300 below, the output sub-circuit 300 is coupled to the second node N2, the third node N3, and the plurality of drive output terminals Output1 to Output4, and the plurality of drive output terminals Output1 to Output4 correspond one-to-one with the plurality of output clock signal terminals CLKE1 to CLKE4. The output sub-circuit 300 is configured to, in response to the signals of the second node N2, provide signals of the plurality of output clock signal terminals CLKE1 to CLKE4 to the corresponding drive output terminals Output1 to Output4; and, in response to the signal of the third node N3, provide the signal of the reference signal terminal VGL to the plurality of drive output terminals Output1 to Output4.

The output sub-circuit 300 in the embodiments of the present disclosure includes multiple drive output terminals Output1 to Output4, and the multiple drive output terminals Output1 to Output4 output signals in the output clock signal terminals CLKE1 to CLKE4 at the same one moment. Referring to FIG. 5, one output sub-circuit 300 includes four drive output terminals Output1 to Output4, which simultaneously output signals externally.

It should be noted that the rising edge moment and the falling edge moment of output signals of the output clock signal terminals are different.

The output sub-circuit 300 serves to output the signals of the output clock signal terminals CLKE1 to CLKE4 through the drive output terminals Output1 to Output4 when the second node N2, i.e., the pull-up node, is at a high level, o, to output the signal of the reference signal terminal VGL through the drive output terminals Output1 to Output4 when the third node N3, i.e., the pull-down node, is at a high level.

In the embodiments of the present disclosure, the output sub-circuit 300 includes: a first gating control sub-circuit 301 and a plurality of output control sub-circuits 302.

The first gating control sub-circuit 301 is configured to provide the signal of the first high-level signal terminal GVDD1 to the fourth node N4 in response to the signal of the second node N2 and the signal of the third gating clock terminal CLKD3, provide the signal of the third gating clock terminal CLKD3 to the fourth node N4 in response to the signal of the second gating clock terminal CLKD2, and provide the signal of the leakage control terminal VGH to the output control sub-circuit 302 in response to the signal of the signal of the fifth node N5.

In the implementation, the first gating control sub-circuit 301 controls the high or low level of the fourth node N4, and the high or low level of the fourth node N4 directly determines whether the drive output terminals Output1 to Output4 are enabled. Additionally, the first gating control sub-circuit 301 inhibits the leakage of the transistor that is coupled to the fourth node N4 through the leakage control terminal VGH.

Referring to FIG. 5, the first gating control sub-circuit 301 includes: a tenth transistor T10, an eleventh transistor T11, a twelfth transistor T12, a thirteenth transistor T13, and a fourteenth transistor T14.

The tenth transistor T10 is connected to the other transistors in FIG. 5 in the following relationship: a control terminal of the tenth transistor T10 is coupled to the second node N2, a first terminal of the tenth transistor T10 is coupled to a second terminal of the eleventh transistor T11, and a second terminal of the tenth transistor T10 is coupled to the fourth node N4.

In the implementation, when the level of the second node N2 is a high level, the control terminal of the tenth transistor T10 is at a high level and the tenth transistor T10 is turned on.

The eleventh transistor T11 is connected to the other transistors in FIG. 5 in the following relationship: a control terminal of the eleventh transistor T11 is coupled to the third gating clock terminal CLKD3, and a first terminal of the eleventh transistor T11 is coupled to the first high-level signal terminal GVDD1.

In the implementation, when the signal of the third gating clock terminal CLKD3 is at a high level, the control terminal of the eleventh transistor T11 is at a high level and the eleventh transistor T11 is turned on. The high level of the first high-level signal terminal GVDD1 is provided to the fourth node N4 via the turned-on tenth transistor T10 and the turned-on eleventh transistor T11.

The twelfth transistor T12 is connected to the other the transistors in FIG. 5 in the following relationship: a control terminal of the twelfth transistor T12 is coupled to the second gating clock terminal CLKD2, a first terminal of the twelfth transistor T12 is coupled to the third gating clock terminal CLKD3, and a second terminal of the twelfth transistor T12 is coupled to a first terminal of the fourteenth transistor T14.

In the implementation, when the second gating clock terminal CLKD2 is at a high level, the control terminal of the twelfth transistor T12 is at a high level and the twelfth transistor T12 is turned on.

The thirteenth transistor T13 is connected to the other transistors in FIG. 5 in the following relationship: a control terminal of the thirteenth transistor T13 is coupled to the second gating clock terminal CLKD2, a first terminal of the thirteenth transistor T13 is coupled to the first terminal of the twelfth transistor T12, and a second terminal of the thirteenth transistor T13 is coupled to the fourth node N4.

In the implementation, when the second gating clock terminal CLKD2 is at a high level, the thirteenth transistor T13 also is turned on, and the signal of the third gating clock terminal CLKD3 is provided to the fourth node N4 via the turned-on twelfth transistor T12 and the turned-on thirteenth transistor T13.

The fourteenth transistor T14 is connected to the other transistors in FIG. 5 in the following relationship: a control terminal of the fourteenth transistor T14 is coupled to the fifth node N5, and a second terminal of the fourteenth transistor T14 is coupled to the leakage control terminal VGH.

In the implementation, when the signal of the fifth node N5 is at a high level, the fourteenth transistor T14 is turned on and the control terminal of the fourteenth transistor T14 is at a high level. The signal of the leakage control terminal VGH is provided to the sixth node through the turned-on fourteenth transistor T14 to inhibit the leakage of the eighteenth transistor T18 and the nineteenth transistor T19 that are coupled to the sixth node N6.

After introducing the first gating control sub-circuit 301, the plurality of output control sub-circuits 302 are continued to be introduced, and the number of output control sub-circuits 302 is a positive integer greater than or equal to 2.

In the embodiments of the present disclosure, the plurality of output control sub-circuits 302 and the plurality of drive output terminals Output1 to Output4 as well as the plurality of output clock signal terminals CLKE1 to CLKE4 are in one-to-one correspondence. In the implementation, the output control sub-circuits are configured to make a conduction between the fourth node N4 and the fifth node N5 in response to the signal of the third gating clock terminal CLKD3, provide the signals of the output clock signal terminals CLKE1 to CLKE4 to the corresponding drive output terminals Output1 to Output4 in response to the signal of the signal of the fifth node N5, provide the signal of the reference signal terminal VGL to the corresponding drive output terminals Output1 to Output4 in response to the signal of the third node N3, and, provide the signal of the first low-level signal terminal LVGL to the fifth node N5 with the drive output terminals Output1 to Output4 in response to the signal of the third node N3.

Figure 6:
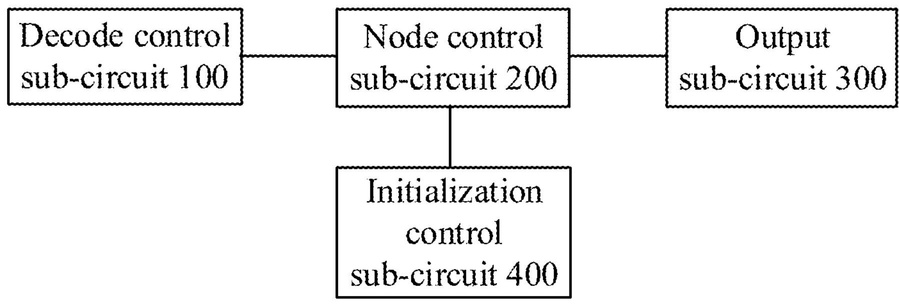
FIG. 6 shows a schematic diagram of a connection of another shift register unit in embodiments of the present disclosure.

It should be added that the output control sub-circuits 302 are in a one-to-one correspondence with the drive output terminals Output1 to Output4, and referring to FIG. 5, the number of the output control sub-circuits 302 is four, and the number of the drive output terminals Output1 to Output4 is four. The drive output terminals Output1 to Output4 are also in a one-to-one correspondence with the output clock signal terminals CLKE1 to CLKE4, and referring to FIG. 6, the number of output clock signal terminals CLKE1 to CLKE4 is also four.

Exemplarily, referring to FIG. 5, an output control sub-circuit 302 at the first path includes: a fifteenth transistor T15, a sixteenth transistor T16, a seventeenth transistor T17, an eighteenth transistor T18, a nineteenth transistor T19, and a third capacitor C3. The output control sub-circuit 302 corresponds to the output clock signal terminal as CLKE1 and the drive output terminal as Output1.

Exemplarily, referring to FIG. 5, an output control sub-circuit 302 at the second path includes: a fifteenth transistor T15', a sixteenth transistor T16', a seventeenth transistor T17', an eighteenth transistor T18', a nineteenth transistor T19' and the third capacitor C3'. The output control sub-circuit 302 corresponds to the output clock signal terminal as CLKE2 and the drive output terminal as Output2.

Exemplarily, referring to FIG. 5, an output control sub-circuit 302 at the third path includes: a fifteenth transistor T15", a sixteenth transistor T16", a seventeenth transistor T17", an eighteenth transistor T18", a nineteenth transistor T19", and a third capacitor C3". The output control sub-circuit 302 corresponds to the output clock signal terminal as CLKE3 and the drive output terminal as Output3.

Exemplarily, referring to FIG. 5, an output control sub-circuit 302 at the fourth path includes: a fifteenth transistor T15'", a sixteenth transistor T16'", a seventeenth transistor T17'", an eighteenth transistor T18'", a nineteenth transistor T19'" and the third capacitor C3'". The output control sub-circuit 302 corresponds to the output clock signal terminal as CLKE4 and the drive output terminal as Output4.

In the implementation, when the signal of the third gating clock terminal CLKD3 is at a high level, the high level of the fourth node N4 is provided to the fifth node N5. When the fifth node N5 at a high level, the sixteenth transistor T16 coupled to the drive output terminals Output1 to Output4 is turned on, and the signals of the output clock signal terminals CLKE1 to CLKE4 are provided to the corresponding drive output terminals Output1 to Output4 through the turned-on sixteenth transistor. When the third node N3 is at a high level, the eighteenth transistor T18 and the nineteenth transistor T19 are turned on, and the signal of the reference signal terminal VGL is provided to the corresponding drive output terminals Output1 to Output4 through the turned-on eighteenth transistor T18 and the turned-on nineteenth transistor T19. When the third node N3 is a high level, the seventeenth transistor T17 is turned on, and the signal of the first low-level signal terminal LVGL is provided to the fifth node N5 and the drive output terminals Output1 to Output4.

Referring to FIG. 5, the output control subunit includes: a fifteenth transistor T15, a sixteenth transistor T16, a seventeenth transistor T17, an eighteenth transistor T18, a nineteenth transistor T19, and a third capacitor C3.

The fifteenth transistor T15 is connected to the other transistors in FIG. 5 in the following relationship: a control terminal of the fifteenth transistor T15 is coupled to the third gating clock terminal CLKD3, a first terminal of the fifteenth transistor T15 is coupled to the fourth node N4, and a second terminal of the fifteenth transistor T15 is coupled to the fifth node N5.

In the implementation, when the signal of the third gating clock terminal CLKD3 at a high level, the control terminal of the fifteenth transistor T15 is at a high level, the fifteenth transistor T15 is turned on, and the signal of the fourth node N4 is provided to the fifth node N5 via the turned-on fifteenth transistor T15, and when the fourth node N4 is at a high level, the fifth node N5 is also at a high level.

The sixteenth transistor T16 is connected to the other transistors in FIG. 5 in the following relationship: a control terminal of the sixteenth transistor T16 is coupled to the fifth node N5, a first terminal of the sixteenth transistor T16 is coupled to the first output clock signal terminal CLKE1, and a second terminal of the sixteenth transistor T16 is coupled to the drive output terminals Output1 to Output4.

In the implementation, when the fifth node N5 is at a high level, the control terminal of the sixteenth transistor T16 is at a high level, the sixteenth transistor T16 is turned on, and the signal of the first output clock signal terminal CLKE1 is provided to the correspondingly connected drive output terminals Output1 to Output4 via the turned-on sixteenth transistor T16. When the fifth node N5 is at a low level, the sixteenth transistor T16 is turned off, and the corresponding connected drive output terminals Output1 to Output4 do not output.

The seventeenth transistor T17 is connected to the other transistors in FIG. 5 in the following relationship: a control terminal of the seventeenth transistor T17 is coupled to the third node N3, a first terminal of the seventeenth transistor T17 is coupled to the drive output terminals Output1 to Output4, and a second terminal of the seventeenth transistor T17 is coupled to the second low-level signal terminal.

In the implementation, when the third node N3 is at a high level, the seventeenth transistor T17 is turned on, and the low level of the second low-level signal terminal is provided to the drive output terminals Output1 to Output4 and the fifth node N5 via the turned-on seventeenth transistor T17 to realize the reset of the drive output terminals Output1 to Output4 and the fifth node N5.

The eighteenth transistor T18 is connected to the other transistors in FIG. 5 in the following relationship: a control terminal of the eighteenth transistor T18 is coupled to the third node N3, a first terminal of the eighteenth transistor T18 is coupled to the fifth node N5, and a second terminal of the eighteenth transistor T18 is coupled to a first terminal of the nineteenth transistor T19.

Referring to FIG. 5, when the third node N3 is at a high level, the control terminal of the eighteenth transistor T18 is at a high level and the eighteenth transistor T18 is turned on.

The nineteenth transistor T19 is connected to the other transistors in FIG. 5 in the following relationship: a control terminal of the nineteenth transistor T19 is coupled to the third node N3, and a second terminal of the nineteenth transistor T19 is coupled to the first low-level signal terminal LVGL.

Referring to FIG. 5, when the third node N3 is at a high level, the control terminal of the nineteenth transistor T19 is at a high level and the nineteenth transistor T19 is turned on.

In the implementation, the low level of the first low-level signal terminal LVGL is provided to the fifth node N5 via the turned-on eighteenth transistor T18 and the turned-on nineteenth transistor T19 to realize the reset of the fifth node N5.

The third capacitor(s) C3 is connected to the other transistors in FIG. 5 in the following relationship: a first terminal of the third capacitor(s) C3 is coupled to the fifth node N5, and a second terminal of the third capacitor(s) C3 is coupled to the drive output terminals Output1 to Output4.

It should be noted that the number of third capacitors C3 coupled to the drive output terminals Output1 to Output4 corresponds one-to-one with the number of drive output terminals Output1 to Output4. The third capacitor C3 is set to stabilize the voltage at the fifth node N5. Moreover, the third capacitor C3 is set to effectively filter out the signals of the drive output terminals Output1 to Output4.

Furthermore, it should be added that, referring to FIG. 5, the shift register unit in the embodiment of the present disclosure further includes an initialization control sub-circuit 400. The initialization control sub-circuit 400 is coupled to the second node N2 and the third node N3, and is configured to, in response to the signal of the initialization signal terminal, provide the signal of the first low-level signal terminal LVGL to the second node N2, and in response to the signal of the initialization signal terminal, provide the signal of the first high-level signal terminal GVDD1 to the third node N3.

The initialization control sub-circuit 400 is used to initialize the levels of the second node N2 and the third node N3 before the first gating clock terminal CLKD1, the second gating clock terminal CLKD2, and the third gating clock terminal CLKD3 become effective after power-up. That is, the initial level of the second node N2 is set to a low level, i.e., the pull-up node is at a low level, so that the corresponding drive output terminals Output1 to Output4 are not enabled to output signals, and at the same time, the initial level of the third node N3 is set to a high level, that is, the pull-down node is at a high level.

Referring to FIG. 5, the initialization control sub-circuit 400 includes: a twentieth transistor T20, a twenty-first transistor T21, and a twenty-second transistor T22.

The twentieth transistor T20 is connected to the other transistors in FIG. 5 in the following relationship: a control terminal of the twentieth transistor T20 is coupled to the initialization signal terminal, a first terminal of the twentieth transistor T20 is coupled to the second node N2, and a second terminal of the twentieth transistor T20 is coupled to a first terminal of the twenty-second transistor T22.

In the implementation, when the initialization signal terminal is at a high level, the control terminal of the twentieth transistor T20 is at a high level, and the twentieth transistor T20 is turned on.

The twentieth transistor T21 is connected to the other transistors in FIG. 5 in the following relationship: a control terminal of the twentieth transistor T21 is coupled to the initialization signal terminal, a first terminal of the twentieth transistor T21 is coupled to the first high-level signal terminal GVDD1, and a second terminal of the twentieth transistor T21 is coupled to the third node N3.

In the implementation, when the initialization signal terminal is at a high level, the twenty-first transistor T21 is turned on, and a high level of the first high-level signal terminal GVDD1 is provided to the third node N3, so that the initial level of the pull-down node is at a high level.

The twenty-second transistor T22 is connected to the other transistors in FIG. 5 in the following relationship: a control terminal of the twenty-second transistor T22 is coupled to the initialization signal terminal, and a second terminal of the twenty-second transistor T22 is coupled to the second terminal of the second capacitor C2.

In the implementation, when the initialization signal terminal is at a high level, the control terminal of the twenty-two transistors T22 is at a high level and the twenty-two transistors T22 is turned on. The low level of the first low-level signal terminal LVGL is provided to the second node N2 via the turned-on twentieth transistor T20 and the turned-on twenty-second transistor T22, so that the initial level of the pull-up node is a low level, the level of the pull-up node is an invalid level, and the output transistor(s) are unable to be turned on, and no signal is output by the drive output terminal(s).

It should be added that, the above mentioned shift register unit is illustrated with the N-type transistor shown in FIG. 5, and in some embodiments, when the N-type transistor is replaced with a P-type transistor, the above mentioned levels provided to the respective transistors and the respective nodes need to be adjusted to levels matching those of the P-type transistor. However, the control logic of the display partition and the display group (i.e., the shift register unit) mentioned in the embodiments of the present disclosure remains unchanged and will not be repeated herein.

Figure 8:
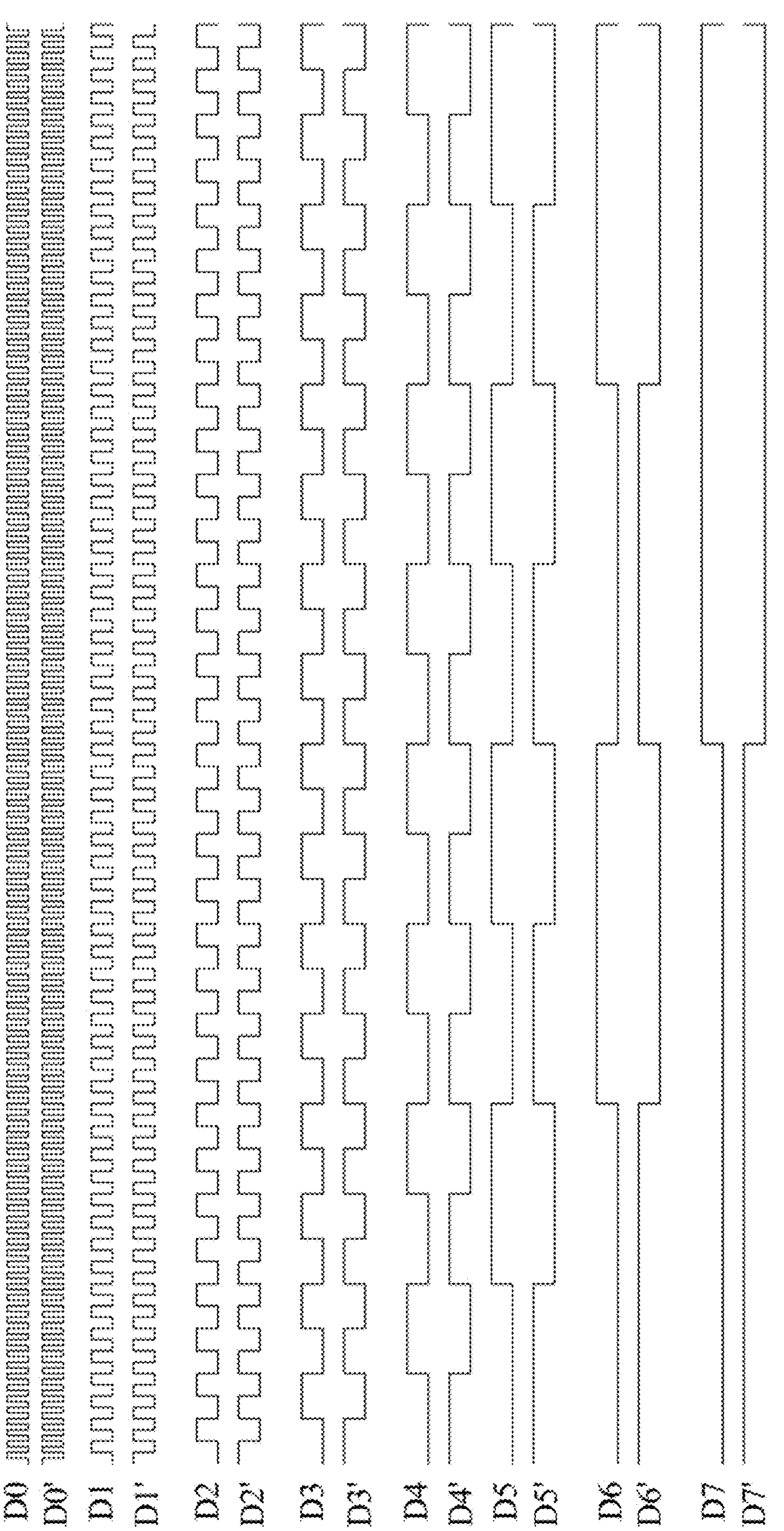
FIG. 8 shows a timing diagram of signals of gating control terminals in embodiments of the present disclosure.

Referring to FIG. 5, FIG. 7 and FIG. 8, the main work process of the shift register is described below in conjunction with the timing chart.

In the timing stage to: the level of the initialization signal terminal TRS=1, the level of the second gating clock terminal CLKD2=0, the level of the first gating clock terminal CLKD1=0, the level of the third gating clock terminal CLKD3=0, the levels of CLKE1 to CLKE12 are all 0, the levels of the gating control terminal D0 to D7 are all 1, the level of the first node N1=0, the level of the second node N2=0, the level of the third node N3=0, the level of the fifth node N5=0, the level of the fifth node N5'=0, the level of the fifth node N5"=0, the level of the fifth node N5'"=0, the level of the drive output terminal Output1=0, the level of the drive output terminal Output2=0, the level of the drive output terminal Output3=0, the level of the drive output terminal Output4=0.

After the shift register unit is powered up, the signal of the initialization signal terminal TRS is at a high level, the twentieth transistor T20, the twenty-first transistor T21, and the twenty-second transistor T22 are all turned on. The high level signal of the first high-level signal terminal GVDD1 causes the level of the third node N3 to be a high level via the turned-on twenty-first transistor T21, and the high level signal of the first high-level signal terminal GVDD1 is provided to the second capacitor C2 via the turned-on twenty-first transistor T21 and the turned-on twenty-second transistor T22.

In the timing stage t1: the level of the initialization signal terminal TRS=0, the level of the second gating clock terminal CLKD2=1, the level of the first gating clock terminal CLKD1=0, the level of the third gating clock terminal CLKD3=0, the levels of the gating control terminals D0 to D7 are all 1, the level of the first node N1=0, the level of the second node N2=1, the level of the third node N3=1, the level of the fifth node N5=0, the level of the fifth node N5'=0, the level of the fifth node N5"=0, the level of the fifth node N5"=0, the level of the drive output terminal Output1=0, the level of the drive output terminal Output2=0, the level of the drive output terminal Output3=0, the level of the drive output terminal Output4=0.

The signal of the second gating clock terminal CLKD2 is at a high level, the first transistor T1 is turned on, and the high level signal of the first high-level signal terminal GVDD1 is provided to the second node N2 through the turned-on first transistor T1. Before this timing has not entered the enabled stage, the signals of the gating control terminals D0 to D7 are all set at the high level, and the gating control terminals D0 to D7 are all 1.

In this timing, the third node N3 is maintained at the high level due to the second capacitor C2.

In this timing, since the signal of the third gating clock terminal CLKD3 is at a low level and the level of the fifth node N5 is at a low level, the drive output terminals Output1 to Output4 are not able to output signals.

In timing stage t2: the level of the initialization signal terminal TRS=0, the level of the second gating clock terminal CLKD2=0, the level of the first gating clock terminal CLKD1=1, the level of the third gating clock terminal CLKD3=0, the levels of the gating control terminals D0 to D7 are all 0, the first node N1=0, the second node N2=1, the third node N3=1, the fifth node N5=0, the fifth node N5'=0, the level of the fifth node N5"=0, the level of the fifth node N5"=0, the level of the drive output terminal Output1=0, the level of the drive output terminal Output2=0, the drive output terminal Output3=0, the level of the drive output terminal Output4=0.

Taking the eight signals of the gating control terminal D0 to D7 as an example for illustration, then, in the timing stage t2, since the gating control signals correspond to 256 ($2^8$) states, when the levels of the signals of the gating control terminals D0 to D7 of the gating control terminal D0 to D7 are all 0, the gating transistors M1, M2, M3, M4, M5, M6, M7, and M8 are all turned off, the signal of the first gating clock terminal CLKD1 is at a high level, but this high level cannot be provided to the first node N1 through any of the gating transistors, and the second node N2 is maintained at a high level under the action of the first capacitance C1. In this timing, the display partition 1 corresponding to the drive output terminals Output1, the drive output terminals Output2, the drive output terminal Output3, and the drive output terminal Output4 is enabled.

It should be added that, while the display partition 1 is enabled, the signals, i.e., including the signals of the gating control terminal D0', the gating control terminals D1 to D7 . . . the gating control terminals D0 to D6, D7' and the like, connected to gating transistors in the other display partitions are signals other than the signals the gating control terminals D0 to D7, so that the signals received by the gating transistors in the other display partitions are signals other than 00000000, e.g., 10000000, . . . , 00000001 and the like. In this manner, at least one of the gating transistors in the other display partition is turned on, so that the level of the first node N1 is a high level, the second transistor T2 is turned on, the third transistor T3 is turned on, and the signal of the second gating clock terminal CLKD2 is at a low level; and this signal of low level can be provided to the second node N2 via the turned-on second transistor T2 and the turned-on third transistor T3, that is, the pull-up node is at a low level, and accordingly, the transistors (e.g., the sixteenth transistor T16) coupled to the drive output terminals Output1 to Output4 are not able to be turned on, and no signal is output from the drive output terminals Output1 to Output4.

In timing stage t3: the level of the initialization signal terminal TRS=0, the level of the second gating clock terminal CLKD2=0, the level of the first gating clock terminal CLKD1=0, the level of the third gating clock terminal CLKD3=1, the levels of the gating control terminal D0 to D7 are all 0, the level of the first node N1=0, the level of the second node N2=1, the level of the third node N3=0, the level of the fifth node N5=0, the level of the fifth node N5'=0, the levels of the fifth node N5"=0, the levels of the fifth node N5"=0, the levels of the drive output terminal Output1=0, the levels of the drive output terminal Output2=0, the level of the drive output terminal Output3=0, the levels of the drive output terminal Output4=0.

The signal of the third gating clock terminal CLKD3 is at a high level, the high level of the third gating clock terminal CLKD3 causes the eleventh transistor T11 to be turned on, the high level signal maintained by the second node N2 causes the tenth transistor T10 to be turned on, the high level signal of the first high-level signal terminal GVDD1 is provided to the sixth node through the turned-on eleventh transistor T11, and the high level signal of the sixth node is provided to the fourth node N4 through the turned-on tenth transistor T10, such that the fourth node N4 is of a high level signal.

In addition, a high level of the third gating clock terminal CLKD3 causes the fifteenth transistor T15 to be turned on, and the high level signal of the fourth node N4 is provided to the fifth node N5 via the turned-on fifteenth transistor T15, such that the signal of the fifth node N5 is also at a high level.

It should be added that, in the embodiment of the present disclosure, since the output sub-circuit 300 includes the plurality of output control sub-circuits, accordingly, the number of drive output terminals Output1 to Output4 corresponds one-to-one with the output control sub-circuits, and the number of the fifth node N5 corresponds to the output control sub-circuits. Referring to FIG. 5, the fifth node N5 includes the fifth node N5, the fifth node N5', the fifth node N5", and the fifth node N5'" in the figure.

In this timing stage t3, the signal of the second node N2 is at a high level, the fifth transistor T5 is turned on, a high level of the third gating clock terminal CLKD3 causes the seventh transistor T7 to be turned on, and a low level of the first gating clock terminal CLKD1 is provided to the third node N3 through the turned-on seventh transistor T7 and the turned-on fifth transistor T5 to cause the signal of the third node N3 to be at a low level.

In timing stage t4: the level of the initialization signal terminal TRS=0, the level of the second gating clock terminal CLKD2=0, the level of the first gating clock terminal CLKD1=0, the level of the third gating clock terminal CLKD3=0, the levels of the gating control terminals D0 to D7 are all 0, the level of the first node N1=0, the level of the second node N2=1, the level of the third node N3=0, the level of the fifth node N5=1, the level of the fifth node N5'=1, the level of the fifth node N5"=1, the level of the fifth node N5"=1, the level of the drive output terminal Output1=1, the level of the drive output terminal Output2=1, the level of the drive output terminal Output3=1, the level of the drive output terminal Output4=1.

The signal of the third gating clock terminal CLKD3 is at a low level, and the sixth node can be reset to be at the low level of the third gating clock terminal CLKD3 by the twelfth transistor and the thirteenth transistor when the signal of the second gating clock terminal CLKD2 is at a high level. However, this reset is not necessary, and the twelfth transistor and the thirteenth transistor can also be removed.

Since the levels of the fifth node N5, the fifth node N5', the fifth node N5", and the fifth node N5'" are maintained at a high level, the high level of the fifth node N5 causes the sixteenth transistor T16 to be turned on, and the plurality of output clock signal terminals CLKE1 to CLKE4 are sequentially enabled according to a preset timing. The signal of the first output clock signal terminal CLKE1 is provided to the drive output terminal Output1 through the turned-on sixteenth transistor T16, the signal of the second output clock signal terminal CLKE2 is provided to the drive output terminal Output2 through the turned-on sixteenth transistor T16, the signal of the third output clock signal terminal CLKE3 is provided to the drive output terminal Output3 through the turned-on sixteenth transistor T16, and the signal of the fourth output clock signal terminal CLKE4 is provided to the drive output terminal Output4 through the turned-on sixteenth transistor T16.

In timing stage t5: the level of the initialization signal terminal TRS=0, the level of the second gating clock terminal CLKD2=0, the level of the first gating clock terminal CLKD1=1, the level of the third gating clock terminal CLKD3=0, the levels of the signals of the gating control terminals D0 to D7 are all 1, the level of the signal of the gating control terminals D0' is 0, and the levels of the gating control terminals D1' to D7' are all 0, the level of the first node N1=1, the level of the second node N2=0, the level of the third node N3=1, the level of the fifth node N5=0, the level of the fifth node N5'=0, the level of the fifth node N5"=0, the level of the fifth node N5"=0, the level of the drive output terminal Output1=0, the level of the drive output terminal Output2=0, the level of the drive output terminal Output3=0, the level of the drive output terminal Output4=0.

Figure 9:
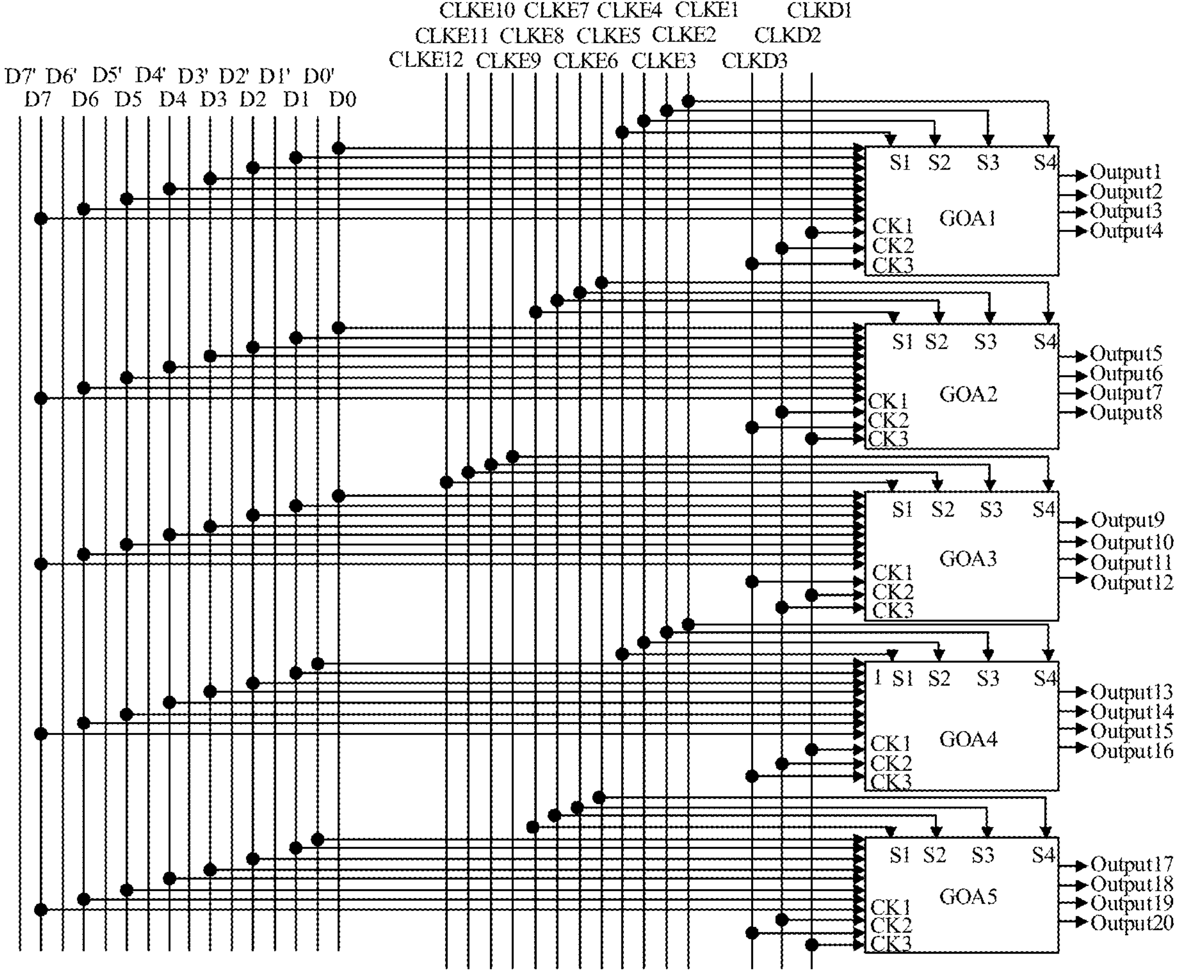
FIG. 9 shows a schematic diagram of a connection in a display apparatus in embodiments of the present disclosure.

In the timing stage t5, it is mainly the reset of the display partition 1. Since the signals of the gating control terminal D0 to D7 are 00000001, the display partition 1 is unable to be enabled. Referring to FIG. 9, that is, no signals are output by the drive output terminals Output1 to Output4 corresponding to GOA1, GOA2 and GOA3.

In the timing stage t5, since the gating transistor M1 is turned on, the signal of the first node N1 is at a high level, the high level of the first node N1 causes the second transistor T2 and the third transistor T3 to be turned on, and a low level of the second gating clock terminal CLKD2 is provided to the P-point through the turned-on second transistor T2 and the turned-on third transistor T3, and the P-point is reset to be at a low level.

At the same time, a high level of the first gating clock terminal CLKD1 causes the sixth transistor T6 to be turned on, a high level of the second high-level signal terminal GVDD2 is provided to the third node N3 via the turned-on sixth transistor T6, a signal of the third node N3 is at a high level, the eighteenth transistor T18 and the nineteenth transistor T19 are turned on, and a low level signal of the first low-level signal terminal LVGL is provided to the fifth node N5 via the turned-on eighteenth transistor T18 and the turned-on nineteenth transistor T19, so that the signal of the fifth node N5 is at a low level. In this manner, the drive transistors in the display partition 1 which are connected to the drive output terminals Output1 to Output4 are turned off.

It should be noted that, the above reset operation in the timing stage t5 is repeated when the display partition 1 is subsequently not enabled, so that the corresponding circuit is noise-reduced.

In addition, since the signals of the gating control terminals D0 to D7 are 00000001, for the next display partition, it is assumed that the next display partition is the display partition 2. Additionally, for the signals of the gating control terminals D0 to D7 connected to the display partition 2, in actual, the signals received by the gating control terminals D0 to D7 in the display partition 2 are 00000000, that is, the display partition 2 is enabled. The specific subsequent work process of the display partition 2 is similar to that of the display partition 1, which will not be repeated herein.

It should be added that, the complete work timing chart of the signals of the gating control terminals D0 to D7 is shown in FIG. 8.

Based on the same inventive concept, an embodiment of the present disclosure provides a gate drive circuit including a plurality of gate lines and any one of the foregoing plurality of shift register units.

The plurality of gate lines are coupled one-to-one with the plurality of drive output terminals Output1 to Output4 in the plurality of shift register units.

Based on the same inventive concept, an embodiment of the present disclosure provides a display apparatus including the gate drive circuit.

The display apparatus provided in the embodiment of the present disclosure may be a tablet computer, a television, a monitor, a laptop computer, a digital photo frame, a navigator, and any other product or component having a display function. Other indispensable components of the display apparatus should be understood by a person of ordinary skill in the art, which are not described herein, and should not be used as a limitation for the present disclosure.

In order to provide the signals of the drive output terminals Output1 to Output4 of the shift register unit to the pixel units in the display apparatus, the display apparatus includes the plurality of gate lines, and the gate lines are coupled one-to-one with the drive output terminals Output1 to Output4.

The division of different display partitions in the display apparatus as well as the division of different shift register units in the same one display partition are described below in connection with FIG. 9.

First, the rules for dividing the different shift register units in the same one display partition are described as below.

The first clock signal terminal CK1 of the $(3k-2)^{th}$ stage shift register unit is coupled to one clock terminal that is the second gating clock terminal CLKD2, the second clock signal terminal CK2 of the $(3k-2)^{th}$ stage shift register unit is coupled to one clock terminal that is the first gating clock terminal CLKD1, and the third clock signal terminal CK3 of the $(3k-2)^{th}$ stage shift register unit is coupled to one clock terminal that is the third gating clock terminal CLKD3.

The first clock signal terminal CK1 of the $(3k-1)^{th}$ stage shift register unit is coupled to one clock terminal that is the first gating clock terminal CLKD1, the second clock signal terminal CK2 of the $(3k-1)^{th}$ stage shift register unit is coupled to one clock terminal that is the third gating clock terminal CLKD3, and the third clock signal terminal CK3 of the $(3k-1)^{th}$ stage shift register unit is coupled to one clock terminal that is the second gating clock terminal CLKD2.

The first clock signal terminal CK1 of the $3k^{th}$ shift register unit is coupled to one clock terminal that is the third gating clock terminal CLKD3, the second clock signal terminal CK2 of the $3k^{th}$ shift register unit is coupled to one clock terminal that is the second gating clock terminal CLKD2, and the third clock signal terminal CK3 of the $3k^{th}$ shift register unit is coupled to one clock terminal that is the first gating clock terminal CLKD1; wherein k is a positive integer. The one display partition is described in detail as the display partition a and k=1.

In order to enable the $1^{st}$ stage shift register unit in the display partition a, for the $1^{st}$ stage shift register unit, of which, the first clock signal terminal CK1 is coupled to one clock terminal that is the second gating clock terminal CLKD2, the second clock signal terminal CK2 is coupled to one clock terminal that is the first gating clock terminal CLKD1, and the third clock signal terminal CK3 is coupled to one clock terminal that is the third clock signal terminal CK3. That is, the clock signal terminals the signals of which are sequentially input into the $1^{st}$ stage shift register unit are the second gating clock terminal CLKD2, the first gating clock terminal CLKD1, and the third gating clock terminal CLKD3.

In order to enable the $2^{nd}$ stage shift register unit in the display partition a, for the $2^{nd}$ stage shift register unit, of which, the first clock signal terminal CK1 is coupled to one clock terminal that is the first gating clock terminal CLKD1, the second clock signal terminal CK2 is coupled to one clock terminal that is the third gating clock terminal CLKD3, and the third clock signal terminal CK3 is coupled to one clock terminal that is the second gating clock terminal CLKD2.

That is, the clock signal terminals the signals of which are sequentially input into the $2^{nd}$ stage shift register unit are the first gating clock terminal CLKD1, the third gating clock terminal CLKD3, and the second gating clock terminal CLKD2.

In order to enable the $3^{rd}$ stage shift register unit in the display partition a, for the $3^{rd}$ stage shift register unit, of which, the first clock signal terminal CK1 is coupled to one clock terminal that is the third gating clock terminal CLKD3, the second clock signal terminal CK2 is coupled to one clock terminal that is the second gating clock terminal CLKD2, and the third clock signal terminal CK3 is coupled to one clock terminal that is, the first gating clock terminal CLKD1. That is, the clock signal terminals the signals of which are sequentially input into the $3^{rd}$ stage shift register unit are the third gating clock terminal CLKD3, the second gating clock terminal CLKD2, and the first gating clock terminal CLKD1.

Referring to FIG. 9, as shown in FIG. 9, in the same one display partition a, one shift register unit in the display partition can be uniquely enabled by different combinations of signals of the first gating clock terminal CLKD1, the second gating clock terminal CLKD2, and the third gating clock terminal CLKD3, that is, the plurality of drive output terminals Output1 to Output4 included in the shift register unit can be realized to simultaneously output.

It should be added that, referring to FIG. 9, in the embodiments of the present disclosure, the shift register units in the other display partitions are also enabled by the first gating clock terminal CLKD1, the second gating clock terminal CLKD2, and the third gating clock terminal CLKD3. That is to say, in the other display partitions, the first gating clock terminal CLKD1, the second gating clock terminal CLKD2 and the third gating clock terminal CLKD3 are also connected to the shift register units by using the above connection relationship, and the shift register units can be enabled accordingly by the signals corresponding to the same one group of gating clock terminals (i.e., the first gating clock terminal CLKD1, the second gating clock terminal CLKD2 and the third gating clock terminal CLKD3) of different display partitions can be enabled to pass through.

However, since the display partition is uniquely enabled by the signals of the gating control terminals D0 to D7, the shift register units enabled by the same one group of gating clock terminals in the different display partitions do not output signals outwardly at the same time. Only when both the display partition and the shift register unit are enabled at the same time, the shift register unit outputs the signal(s) outwardly.

In order to satisfy the requirement that the shift register units do not simultaneously output signals outwardly, the timing of the signals of the output clock signal terminals connected to the drive output terminals of the display groups corresponding to the same one display partition are not overlapped. Referring to FIGS. 8 and 9, when one display partition includes three display groups and each display group includes four drive output terminals, that is, when the drive output terminals corresponding to the display partition are 12 of Output1, Output2, . . . , Output12, the signals of the output clock signal terminals are CLKE1, CLKE2, CLKE1, CLKE2, CLKE3, . . . , CLKE12, and the timing of the CLKE1, CLKE2, CLKE3, . . . , CLKE12 is shown in FIG. 7.

In addition, in order to ensure that only one display group in one display partition can be uniquely enabled in the display apparatus at one moment, when the number of display groups in one display partition and the number of drive output terminals in one display group change, the number of signals of the output clock signal terminals also changes accordingly. Assuming that the number of display groups in one display partition is M and the number of drive output terminals in one display group is N, the number of output clock signal terminals to be connected to the display partition is M*N.

The rules for dividing the different display partitions in the display apparatus are described as below.

The gating control terminals D0 to D7 of the $(3k-2)^{th}$ stage shift register unit, the $(3k-1)^{th}$ stage shift register unit, and the $3k^{th}$ stage shift register unit are coupled to one signal line group, wherein k is a positive integer.

In the embodiments of the present disclosure, one display partition includes three shift register units that are adjacent to one another. In other embodiments, the number of shift register units included in one display partition is variable, but in order to be able to enable different shift register units in one display partition, the number of gating clock terminals included in the same one group of gating clock terminals has to be adjusted accordingly to ensure that the combination of the gating clock terminals is able to uniquely enable one shift register unit.

Furthermore, it should be added that, the number of display partitions included in one display apparatus is also adjustable. However, in order for only one display partition in the display apparatus to be enabled for output, the number of the gating control terminals D0 to D7 also needs to be adjusted accordingly, which will not be repeated herein.

In addition, in the embodiments of the present disclosure, in order to differentiate different display partitions, different signal line groups are connected to shift register units belonging to different display partitions, which the signal line group is used to receive signals of the gating control terminals D0 to D7.

The gating control terminals D0 to D7 of the $(6k-5)^{th}$ stage shift register unit, $(6k-4)^{th}$ stage shift register unit, and $(6k-3)^{th}$ stage shift register unit are coupled to the first signal line group.

The gating control terminals D0 to D7 of the $(6k-2)^{th}$ stage shift register unit, the $(6k-1)^{th}$ stage shift register unit, and the $6k^{th}$ stage shift register unit are coupled to the second signal line group, wherein the output signals of the first signal line group are different from those of the second signal line group, and k is a positive integer.

In the embodiments of the present disclosure, the shift register units connected to the signal line group outputting the same output signals are in the same one display partition.

The division of the display partitions is determined by the signal line groups, the shift register units connected to the signal line group outputting the same output signals are in the same one display partition, and the shift register units connected to the signal line groups outputting different signals are in different display partitions.

The following is a detailed explanation by dividing the display apparatus into the display partition a and the display partition b, k=1 and k=2.

The $1^{st}$ stage shift register unit, the $2^{nd}$ stage shift register unit, and the $3^{rd}$ stage shift register unit constitute the display partition a, and the $4^{th}$ shift register unit, the $5^{th}$ stage shift register unit, and the $6^{th}$ stage shift register unit constitute the display partition b.

The gating control terminals D0 to D7 corresponding to the display partition a are coupled to one signal line group, and as can be seen from FIG. 9, the gating control terminals D0 to D7 connected to the one signal line group coupled to the display partition a are the gating control terminals D0, D1, D2, D3, D4, D5, D6 and D7.

The gating control terminals D0 to D7 corresponding to the display partition b are coupled to another signal line group, and as can be seen from FIG. 9, the gating control terminals D0 to D7 connected to the another signal line group coupled to the display partition b are the gating control terminals D0', D1, D2, D3, D4, D5, D6 and D7.

In order to facilitate providing signals to the gating control terminals D0 to D7, the display apparatus in the embodiments of the present disclosure further includes a decoder, and the output terminals of the decoder provide different output signals for the first signal line group and the second signal line group.

The decoder is a multi-input multi-output combinational logic circuit device, and it is assumed that, a total number of output ports of the decoder is 8, which are an output port 1, an output port 2, an output port 3, an output port 4, an output port 5, an output port 6, an output port 7 and an output port 8.

In order to make more signals received by the gating control terminals D0 to D7, in the embodiments of the present disclosure, the output port 1, output port 2, the output port 3, the output port 4, the output port 5, the output port 6, the output port 7 and the output port 8 are all inversely expanded. That is, the signal of the output port 1 is inverted to be outputted through the output port 9, the signal of the output port 2 is inverted to be outputted through the output port 10, and so on, thereby obtaining the output port 9, the output port 10, the output port 11, the output port 12, the output port 13, the output port 14, the output port 15, and the output port 16.

In the embodiments of the present disclosure, when the number of gating transistors is 8, the corresponding gating control terminals D0 to D7 may be connected to 8 output ports among the output port 1 to output port 16. It should be noted that, no duplicate ports can exist in the output ports connected to the gating control terminals D0 to D7, and the duplicate ports herein include an output port and another output port in inverse phase with the output port. That is to say, only one of the output port and another output port in inverse phase with the output port can be selected to be connected.

The above is only an example to illustrate the specific structure of the display apparatus provided by the embodiments of the present invention, and in the specific implementation, the above specific structure is not limited to the above structure provided by the embodiments of the present disclosure, but may also be other structures known to the person skilled in the art, which will not be limited herein.

Based on the same inventive concept, referring to FIG. 10, the present disclosure embodiments provide a driving method of the shift register unit, including the following.

Step 201: the decode control sub-circuit 100 make a conduction between the first gating clock terminal CLKD1 and the first node N1 in response to the signals of the gating control terminals D0 to D7.

In the implementation, when the signals of the gating control terminals D0 to D7 are valid signals, at least one gating transistor among the gating transistors included in the decode control sub-circuit 100 is turned on, and a high level signal of the first gating clock terminal CLKD1 is provided to the first node N1 through the turned-on gating transistor, and the first node N1 is at a high level.

When the signals of the gating control terminals D0 to D7 are invalid signals, the gating transistors included in the decode control sub-circuit 100 are turned off, the high level signal of the first gating clock terminal CLKD1 cannot be provided to the first node N1 via the turned-on gating transistor, and the first node N1 is at a low level.

It should be added that, in the embodiments of the present disclosure, the signals of the gating control terminals D0 to D7 are provided by an external decoder, and at the same one moment, the signals provided by the decoder to the gating control terminals D0 to D7 are capable of making at least one of the signals of the gating control terminals D0 to D7 valid. That is, the first node N1 corresponding to at least one shift register unit is at a high level. However, at the same one moment, the signals provided by the decoder to the gating control terminals D0 to D7 are capable of making the signals of the only one of the gating control terminals D0 to D7 invalid. That is, the first node N1 corresponding to only one of the shift register units is at a low level.

Step 202: the node control sub-circuit 200 controls the signal of the second node N2 and the signal of the third node N3 in response to the signal of the first gating clock terminal CLKD1, the signal of the second gating clock terminal CLKD2, and the signal of the first node N1.

In the embodiments of the present disclosure, the second node N2 is the pull-up node in the shift register, and the third node N3 is the pull-down node in the shift register. In the implementation, under the action of the signal of the first gating clock terminal CLKD1, the signal of the second gating clock terminal CLKD2, and the signal of the first node N1, the node control sub-circuit 200 controls the signals of the second node N2 and the third node N3, that is, the levels of the second node N2 and the third node N3 are set by the node control sub-circuit 200.

In the implementation, when the first node N1 is at a high level, the second node N2 is at a low level, in which case the coupled drive output terminals Output1 to Output4 are unable to be enabled to output signals. When the first node N1 is at a low level, the second node N2 is at a high level, in which case the drive output terminals Output1 to Output4 coupled to the second node N2 are able to be enabled to output signals.

Step 203: the output sub-circuit 300 provides signals of the plurality of output clock signal terminals CLKE1 to CLKE4 to the corresponding drive output terminals Output1 to Output4 in response to the signal of the second node N2; and provides the signal of the reference signal terminal VGL to the plurality of drive output terminals Output1 to Output4 in response to the signal of the third node N3.

In embodiments of the present disclosure, the output sub-circuit 300 includes the first gating control sub-circuit and the plurality of output control sub-circuits, and the plurality of output control sub-circuits belonging to one shift register unit include the plurality of drive output terminals Output1 to Output4. When the second node N2 is at a high level, that is, the pull-up node is at a high level, which correspondingly will cause the fifth node N5 to be at a high level. In this manner, the transistors respectively connected to the drive output terminals Output1 to Output4 are turned on, and the signals of the output clock signal terminals CLKE1 to CLKE4 corresponding one-to-one with the drive output terminals Output1 to Output4 are provided to the corresponding drive output terminals Output1 to Output4 through the above turned on transistors to realize the output for display of the shift register unit. The number of drive output terminals Output1 to Output4 included in the shift register unit corresponds to the number of rows of pixel units for display in the display apparatus.

When the signal of the third node N3 is at a high level, that is, the pull-down node is at a low level, the transistor connected to the reference signal terminal VGL is turned on, and the signal of the reference signal terminal VGL is provided to the corresponding drive output terminals Output1 to Output4 via the turned-on transistor.

In summary, in embodiments of the present disclosure, the shift register unit, the display apparatus and the driving method are provided. The shift register unit includes the decode control sub-circuit, the node control sub-circuit and the output sub-circuit. The decode control sub-circuit is configured to make a conduction between the first gating clock terminal and the first node in response to the signal of the gating control terminal. The node control sub-circuit is coupled to the first node, the second node and the third node, and is configured to control the signals of the second node and the third node in response to the signals of the first gating clock terminal, the second gating clock terminal, and the first node. The output sub-circuit is coupled to the second node, the third node, and the plurality of drive output terminals, and the plurality of drive output terminals are electrically connected to the plurality of output clock signal terminals. The output sub-circuit is configured to provide signals of the plurality of output clock signal terminals to the drive output terminals in response to the signal of the second node, and provide the signal of the reference signal terminal to the plurality of drive output terminals in response to the signal of the third node. That is, the partition setting of the drive output terminals of the shift register units is realized by different combinations of signals of the plurality of gating control terminals, and the grouping setting within the partition is realized by different combinations of the plurality of gating clock terminals, thereby realizing the enabled control for the partitions and groups, which improve the flexibility of the enabled outputs of the drive output terminals on the basis of not requiring additional addition of any hardware unit.

It should be appreciated by those skilled in the art that the embodiments of the present disclosure may be provided as a method, a system, or a computer program product system. Accordingly, the present disclosure may take the form of a fully hardware embodiment, a fully software embodiment, or an embodiment combining software and hardware aspects. Further, the present disclosure may take the form of a computer program product system implemented on one or more computer-usable storage media (including, but not limited to, disk memory, CD-ROM, optical memory, and the like) that contain computer-usable program code therein.

The present disclosure is described with reference to flowcharts and/or block diagrams of methods, apparatus (systems), and computer program product systems according to the present disclosure. It should be understood that each of the processes and/or boxes in the flowchart and/or block diagram, and the combination of processes and/or boxes in the flowchart and/or block diagram, may be implemented by computer program instructions. These computer program instructions may be provided to a processor of a general-purpose computer, a special-purpose computer, an embedded processor, or other programmable data-processing device to produce a machine such that the instructions executed by the processor of the computer or other programmable data-processing device produce a device for carrying out the functions specified in the one process or multiple processes of the flowchart and/or the one box or multiple boxes of the block diagram.

These computer program instructions may also be stored in computer-readable memory capable of directing the computer or other programmable data processing device to operate in a particular manner, such that the instructions stored in the computer-readable memory produce an article of manufacture including an instruction device that implements the function specified one process or a plurality of processes in the flowchart and/or one box or a plurality of boxes in the block diagram.

These computer program instructions may also be loaded onto a computer or other programmable data processing device such that a series of operational steps are performed on the computer or other programmable device to produce computer-implemented processing, such that the instructions executed on the computer or other programmable device provide steps for implementing the function specified one process or a plurality of processes in the flowchart and/or one box or a plurality of boxes in the block diagram.

Obviously, those skilled in the art can make various modifications and variations to the present disclosure without departing from the spirit and scope of the present disclosure. Thus, to the extent that such modifications and variations of the present disclosure are within the scope of the claims and their technical equivalents of the present disclosure, the present disclosure is intended to encompass such modifications and variations.

What is claimed is:

1. A shift register unit, comprising: a decode control sub-circuit, a node control sub-circuit and an output sub-circuit; wherein the decode control sub-circuit is configured to, in response to a signal of a gating control terminal, make a conduction between a first gating clock terminal and a first node;

the node control sub-circuit is coupled to the first node, a second node and a third node, and is configured to, in response to a signal of the first gating clock terminal, a signal of a second gating clock terminal and a signal of the first node, control a signal of the second node and a signal of the third node;

the output sub-circuit is coupled to the second node, the third node and a plurality of drive output terminals, wherein the plurality of drive output terminals are electrically connected to a plurality of output clock signal terminals; and the output sub-circuit is configured to, in response to the signal of the second node, provide signals of the plurality of output clock signal terminals to the drive output terminals, and in response to the signal of the third node, provide a signal of a reference signal terminal to the plurality of drive output terminals.

2. The shift register unit according to claim 1, wherein the decode control sub-circuit comprises: N gating transistors, wherein N is a positive integer greater than or equal to 1; and a control terminal of the gating transistors is coupled to the gating control terminal, a first terminal of the gating transistors is coupled to the first gating clock terminal, and a second terminal of the gating transistors is coupled to the first node.

3. The shift register unit according to claim 1, wherein the node control sub-circuit comprises: a first node control sub-circuit, a second node control sub-circuit, a third node control sub-circuit and a fourth node control sub-circuit;

the first node control sub-circuit is coupled to the first node, and is configured to, in response to a signal of the second gating clock terminal, provide the signal of the first node and a signal of a first high-level signal terminal to the second node;

the second node control sub-circuit is coupled to the second node, and is configured to, in response to the signal of the first node, provide the signal of the second gating clock terminal to the second node;

the third node control sub-circuit is coupled to the first gating clock terminal, the second node and the third node, and is configured to, in response to the signal of the second node and a signal of a third gating clock terminal, provide a signal of a second high-level signal terminal and the signal of the first gating clock terminal to the third node; and the fourth node control sub-circuit is coupled to the third node, and is configured to, in response to the signal of the second gating clock terminal, provide a signal of a first low-level signal terminal to the third node.

4. The shift register unit according to claim 3, wherein the first node control sub-circuit comprises: a first transistor and a first capacitor;

a control terminal of the first transistor is coupled to the second gating clock terminal, a first terminal of the first transistor is coupled to the first high-level signal terminal, and a second terminal of the first transistor is coupled to the second node; and a first terminal of the first capacitor is coupled to the first high-level signal terminal, and a second terminal of the first capacitor is coupled to the second node.

5. The shift register unit according to claim 3, wherein the second node control sub-circuit comprises: a second transistor, a third transistor and a fourth transistor;

a control terminal of the second transistor is coupled to the first node, a first terminal of the second transistor is coupled to the second gating clock terminal, and a second terminal of the second transistor is coupled to a first terminal of the third transistor;

a control terminal of the third transistor is coupled to the first node, and a second terminal of the third transistor is coupled to the second node; and a control terminal of the fourth transistor is coupled to the second node, a first terminal of the fourth transistor is coupled to the first terminal of the third transistor, and a second terminal of the fourth transistor is coupled to the first high-level signal terminal.

6. The shift register unit according to claim 3, wherein the third node control sub-circuit comprises: a fifth transistor, a sixth transistor and a seventh transistor;

a control terminal of the fifth transistor is coupled to the second node, a first terminal of the fifth transistor is coupled to a second terminal of the sixth transistor, and a second terminal of the fifth transistor is coupled to a first terminal of the seventh transistor;

a control terminal of the sixth transistor is coupled to the first gating clock terminal, a first terminal of the sixth transistor is coupled to the second high-level signal terminal, and the second terminal of the sixth transistor is coupled to the first terminal of the fifth transistor; and a control terminal of the seventh transistor is coupled to the third gating clock terminal, and a second terminal of the seventh transistor is coupled to the first gating clock terminal.

7. The shift register unit according to claim 3, wherein the fourth node control sub-circuit comprises: an eighth transistor, a ninth transistor and a second capacitor;

a control terminal of the eighth transistor is coupled to the second gating clock terminal, a first terminal of the eighth transistor is coupled to the first node, and a second terminal of the eighth transistor is coupled to the first gating clock terminal;

a control terminal of the ninth transistor is coupled to a fifth node, a first terminal of the ninth transistor is coupled to the third node, and a second terminal of the ninth transistor is coupled to the first low-level signal terminal; and a first terminal of the second capacitor is coupled to the third node, and a second terminal of the second capacitor is coupled to the first low-level signal terminal.

8. The shift register unit according to claim 1, wherein the output sub-circuit comprises: a first gating control sub-circuit and a plurality of output control sub-circuits;

the first gating control sub-circuit is configured to, in response to the signal of the second node and a signal of a third gating clock terminal, provide a signal of a first high-level signal terminal to a fourth node, and in response to the signal of the second gating clock terminal, provide the signal of the third gating clock terminal to the fourth node, and in response to a signal of a fifth node, provided a signal of a leakage control terminal to the fourth node; and the plurality of output control sub-circuits and the plurality of drive output terminals as well as the plurality of output clock signal terminals are in one-to-one correspondence; the output control sub-circuits is configured to, in response to the signal of the third gating clock terminal, make a conduction between the fourth node and the fifth node;

in response to the signal of the fifth node, provide a signal of an output clock signal terminal to a drive output terminal corresponding to the output clock signal terminal;

in response to the signal of the third node, provide the signal of the reference signal terminal to the drive output terminal; and in response to the signal of the third node, provide a signal of a first low-level signal terminal to the fifth node and the drive output terminal.

9. The shift register unit according to claim 8, wherein the first gating control sub-circuit comprises: a tenth transistor, an eleventh transistor, a twelfth transistor, a thirteenth transistor, and a fourteenth transistor;

a control terminal of the tenth transistor is coupled to the second node, a first terminal of the tenth transistor is coupled to a second terminal of the eleventh transistor, and a second terminal of the tenth transistor is coupled to the fourth node;

a control terminal of the eleventh transistor is coupled to the third gating clock terminal, and a first terminal of the eleventh transistor is coupled to the first high-level signal terminal;

a control terminal of the twelfth transistor is coupled to the second gating clock terminal, a first terminal of the twelfth transistor is coupled to the third gating clock terminal, and a second terminal of the twelfth transistor is coupled to a first terminal of the fourteenth transistor;

a control terminal of the thirteenth transistor is coupled to the second gating clock terminal, a first terminal of the thirteenth transistor is coupled to the first terminal of the twelfth transistor, and a second terminal of the thirteenth transistor is coupled to the fourth node;

a control terminal of the fourteenth transistor is coupled to the fifth node, and the second terminal of the fourteenth transistor is coupled to the leakage control terminal.

10. The shift register unit according to claim 8, wherein the output control sub-circuit comprises: a fifteenth transistor, a sixteenth transistor, a seventeenth transistor, an eighteenth transistor, a nineteenth transistor and a third capacitor;

a control terminal of the fifteenth transistor is coupled to the third gating clock terminal, a first terminal of the fifteenth transistor is coupled to the fourth node, and a second terminal of the fifteenth transistor is coupled to the fifth node;

a control terminal of the sixteenth transistor is coupled to the fifth node, a first terminal of the sixteenth transistor is coupled to the first output clock signal terminal, and a second terminal of the sixteenth transistor is coupled to the drive output terminal;

a control terminal of the seventeenth transistor is coupled to the third node, a first terminal of the seventeenth transistor is coupled to the drive output terminal, and a second terminal of the seventeenth transistor is coupled to a second low-level signal terminal;

a control terminal of the eighteenth transistor is coupled to the third node, a first terminal of the eighteenth transistor is coupled to the fifth node, and a second terminal of the eighteenth transistor is coupled to a first terminal of the nineteenth transistor;

a control terminal of the nineteenth transistor is coupled to the third node, and a second terminal of the nineteenth transistor is coupled to the first low-level signal terminal; and a first terminal of the third capacitor is coupled to the fifth node, and a second terminal of the third capacitor is coupled to the drive output terminal.

11. The shift register unit according to claim 1, further comprising: an initialization control sub-circuit; the initialization control sub-circuit is coupled to the second node and the third node; and the initialization control sub-circuit is configured to, in response to a signal of an initialization signal terminal, provide a signal of a first low-level signal terminal to the second node, and in response to the signal of the initialization signal terminal, provide a signal of a first high-level signal terminal to the third node.

12. The shift register unit according to claim 11, wherein the initialization control sub-circuit comprises: a twentieth transistor, a twenty-first transistor, and a twenty-second transistor;

a control terminal of the twentieth transistor is coupled to the initialization signal terminal, a first terminal of the twentieth transistor is coupled to the second node, and a second terminal of the twentieth transistor is coupled to a first terminal of the twenty-second transistor;

a control terminal of the twenty-first transistor is coupled to the initialization signal terminal, a first terminal of the twenty-first transistor is coupled to the first high-level signal terminal, and a second terminal of the twenty-first transistor is coupled to the third node; and a control terminal of the twenty-second transistor is coupled to the initialization signal terminal, and a second terminal of the twenty-second transistor is coupled to a second terminal of a second capacitor.

13. A gate drive circuit, comprising: a plurality of gate lines and a plurality of shift register units according to claim 1;

wherein the plurality of gate lines are coupled one-to-one with the plurality of drive output terminals in the plurality of shift register units.

14. A display apparatus, comprising: the gate drive circuit according to claim 13.

15. The display apparatus according to claim 14, wherein a first clock signal terminal of a $(3k-2)^{th}$ stage shift register unit is coupled to the second gating clock terminal, a second clock signal terminal of the $(3k-2)^{th}$ stage shift register unit is coupled to the first gating clock terminal, and a third clock signal terminal of the $(3k-2)^{th}$ stage shift register unit is coupled to a third gating clock terminal;

a first clock signal terminal of a shift register units of the $(3k-1)^{th}$ stage is coupled to the first gating clock terminal, a second clock signal terminal of the shift register units of the $(3k-1)^{th}$ stage is coupled to the third gating clock terminal, and a third clock signal terminal of the shift register units of the $(3k-1)^{th}$ stage is coupled to the second gating clock terminal; and a first clock signal terminal of a $3k^{th}$ stage shift register unit is coupled to the third gating clock terminal, a second clock signal terminal of the $3k^{th}$ stage shift register unit is coupled to the second gating clock terminal, and a third clock signal terminal of the $3k^{th}$ stage shift register unit is coupled to the first gating clock terminal; wherein k is a positive integer.

16. The display apparatus according to claim 15, wherein gating control terminals of the $(3k-2)^{th}$ stage shift register unit, the $(3k-1)^{th}$ stage shift register unit, and the $3k^{th}$ stage shift register unit are coupled to one signal line group, wherein k is a positive integer.

17. The display apparatus according to claim 16, wherein gating control terminals of $(6k-5)^{th}$ stage shift register unit, $(6k-4)^{th}$ stage shift register unit, and $(6k-3)^{th}$ stage shift register unit are coupled to a first signal line group; and gating control terminals of $(6k-2)^{th}$ stage shift register unit, $(6k-1)^{th}$ stage shift register unit, and $6k^{th}$ stage shift register unit are coupled to a second signal line group; wherein output signals of the first signal line group are different from output signals of the second signal line group, and k is a positive integer.

18. The display apparatus according to claim 16, further comprising: a decoder, wherein output terminals of the decoder provide different output signals for the first signal line group and the second signal line group.

19. The display apparatus according to claim 14, wherein shift register units correspondingly connected to signal line groups comprising the same output signals are in the same one display partition.

20. A driving method of a shift register unit, comprising:

in response to a signal of a gating control terminal, making, by a decode control sub-circuit, a conduction between a first gating clock terminal and a first node;

in response to a signal of the first gating clock terminal, a signal of a second gating clock terminal, and a signal of the first node, controlling, by a node control sub-circuit, a signal of a second node and a signal of a third node; and in response to the signal of the second node, providing, by an output sub-circuit, signals of a plurality of output clock signal terminals to corresponding drive output terminals; and in response to the signal of the third node, providing, by the output sub-circuit, a signal of a reference signal terminal to the drive output terminals.

* * * * *